(12) United States Patent
Tochibayashi et al.

(10) Patent No.: US 8,846,459 B2
(45) Date of Patent: Sep. 30, 2014

(54) SEMICONDUCTOR DEVICE AND METHOD FOR MANUFACTURING THE SAME

(71) Applicant: Semiconductor Energy Laboratory Co., Ltd., Atsugi (JP)

(72) Inventors: Katsuaki Tochibayashi, Tochigi (JP); Satoshi Higano, Kawachi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/652,708

(22) Filed: Oct. 16, 2012

(65) Prior Publication Data

US 2013/0099233 A1    Apr. 25, 2013

(30) Foreign Application Priority Data

Oct. 24, 2011    (JP) ................................. 2011-233264

(51) Int. Cl.
*H01L 21/335* (2006.01)
*H01L 29/786* (2006.01)
*H01L 21/02* (2006.01)
*H01L 21/3213* (2006.01)
*H01L 21/465* (2006.01)
*H01L 29/66* (2006.01)

(52) U.S. Cl.
CPC ...... *H01L 29/66742* (2013.01); *H01L 29/7869* (2013.01); *H01L 21/02071* (2013.01); *H01L 21/32136* (2013.01); *H01L 21/465* (2013.01)
USPC ........ 438/142; 257/52; 257/43; 257/E29.296; 257/E21.467; 257/E21.476

(58) Field of Classification Search
CPC .......... H01L 29/00; H01L 21/00; H01L 27/00
USPC ............. 438/104; 257/43, E29.296, E21.467, 257/E21.476, 52
See application file for complete search history.

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1737044 A    12/2006
EP    2226847 A    9/2010
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Telly Green
(74) *Attorney, Agent, or Firm* — Eric J. Robinson; Robinson Intellectual Property Law Office, P.C.

(57) ABSTRACT

A highly reliable semiconductor device and a method for manufacturing the semiconductor device are provided. The semiconductor device is manufactured with a high yield to achieve high productivity. In the manufacture of a semiconductor device including a transistor in which a gate electrode layer, a gate insulating film, and an oxide semiconductor film are sequentially stacked and a source electrode layer and a drain electrode layer are provided in contact with the oxide semiconductor film, the source electrode layer and the drain electrode layer are formed through an etching step and then a step for removing impurities which are generated by the etching step and exist on a surface of the oxide semiconductor film and in the vicinity thereof is performed.

6 Claims, 14 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,897,483 B2 * | 3/2011 | Yamazaki et al. ............ 438/459 |
| 8,129,717 B2 | 3/2012 | Yamazaki et al. |
| 8,293,594 B2 * | 10/2012 | Yamazaki et al. ............ 438/155 |
| 8,367,489 B2 * | 2/2013 | Yamazaki ..................... 438/156 |
| 8,390,044 B2 * | 3/2013 | Kawae et al. .................. 257/292 |
| 8,492,806 B2 * | 7/2013 | Yamazaki et al. ............ 257/292 |
| 8,530,285 B2 * | 9/2013 | Yamazaki et al. ............ 438/149 |
| 8,546,161 B2 * | 10/2013 | Yamazaki et al. ............ 438/30 |
| 8,546,181 B2 * | 10/2013 | Yamazaki ..................... 438/104 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0166896 A1 * | 7/2009 | Yamazaki et al. ............ 257/787 |
| 2009/0278122 A1 | 11/2009 | Hosono et al. |
| 2009/0280600 A1 | 11/2009 | Hosono et al. |
| 2010/0025678 A1 * | 2/2010 | Yamazaki et al. ............ 257/43 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0089416 A1 * | 4/2011 | Yamazaki et al. ............ 257/43 |
| 2011/0101336 A1 * | 5/2011 | Yamazaki ..................... 257/43 |
| 2011/0101337 A1 * | 5/2011 | Yamazaki ..................... 257/43 |
| 2011/0101338 A1 * | 5/2011 | Yamazaki et al. ............ 257/43 |
| 2011/0101355 A1 * | 5/2011 | Yamazaki ..................... 257/59 |
| 2011/0101356 A1 * | 5/2011 | Yamazaki ..................... 257/59 |
| 2011/0121284 A1 * | 5/2011 | Yamazaki et al. ............ 257/43 |
| 2011/0121288 A1 * | 5/2011 | Yamazaki et al. ............ 257/43 |
| 2011/0127522 A1 * | 6/2011 | Yamazaki ..................... 257/43 |
| 2011/0127526 A1 * | 6/2011 | Kawae et al. .................. 257/43 |
| 2011/0147739 A1 * | 6/2011 | Yamazaki et al. ............ 257/43 |
| 2011/0156026 A1 * | 6/2011 | Yamazaki et al. ............ 257/43 |
| 2011/0210332 A1 * | 9/2011 | Jintyou et al. ................. 257/59 |
| 2011/0215325 A1 * | 9/2011 | Yamazaki et al. ............ 257/57 |
| 2011/0215331 A1 * | 9/2011 | Yamazaki et al. ............ 257/60 |
| 2012/0033156 A1 * | 2/2012 | Yamazaki et al. ............ 349/62 |
| 2012/0132906 A1 | 5/2012 | Yamazaki |
| 2012/0228615 A1 * | 9/2012 | Uochi ........................... 257/57 |
| 2012/0273773 A1 * | 11/2012 | Ieda et al. ...................... 257/43 |
| 2012/0305913 A1 * | 12/2012 | Yamazaki et al. ............ 257/43 |
| 2013/0082252 A1 * | 4/2013 | Yamazaki ..................... 257/43 |
| 2013/0099230 A1 | 4/2013 | Yamazaki et al. |
| 2013/0099231 A1 * | 4/2013 | Tochibayashi et al. ......... 257/43 |
| 2013/0099234 A1 * | 4/2013 | Yamazaki ..................... 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-181801 | 9/2011 |

(56) References Cited

FOREIGN PATENT DOCUMENTS

JP          2011-181801 A    9/2011
WO     WO-2004/114391        12/2004

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.
Ikeda.T et al., "Full-Functional System Liquid Crystal Display Using CG-Silicon Technology,", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters) , Jun. 17, 1996, vol. 68, No. 25, pp. 3650-3652.
Nakamura.M et al., "The phase relations in the In2O3-Ga2ZnO4-ZnO system at 1350° C.,", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.
Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch INXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID

(56) References Cited

OTHER PUBLICATIONS

Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the In2O3 and Sc2O3-A2O3-Bo Systems [A; Fe, Ga, or Al; N; Mg, Mn, Fe, Ni, Cu, Or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

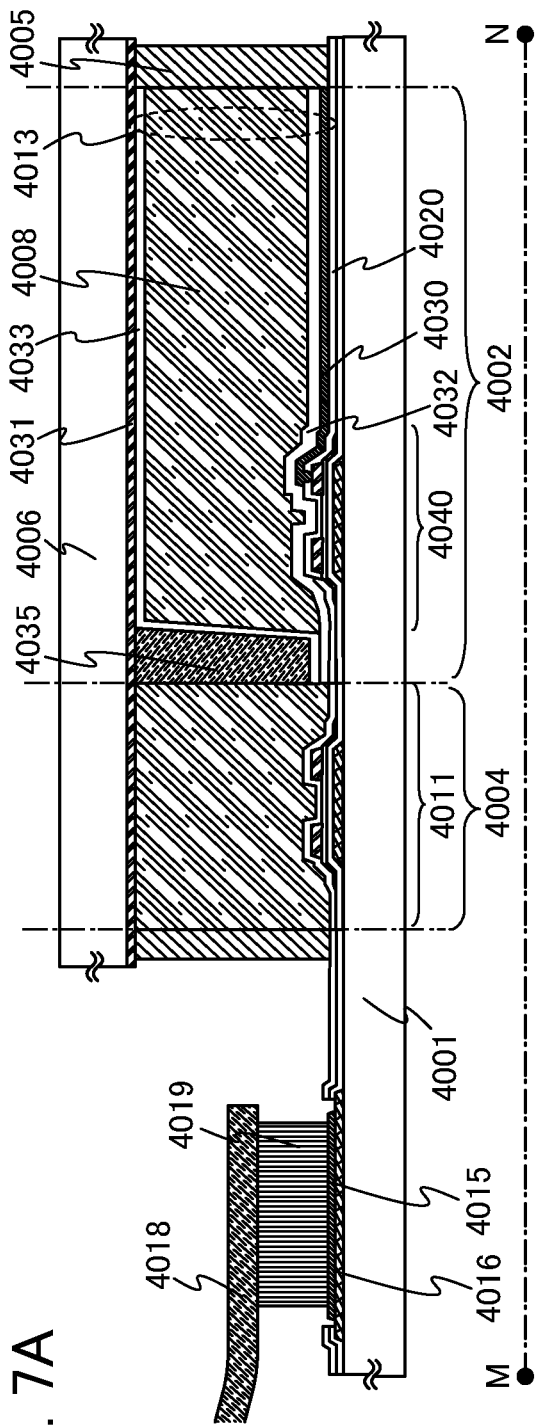
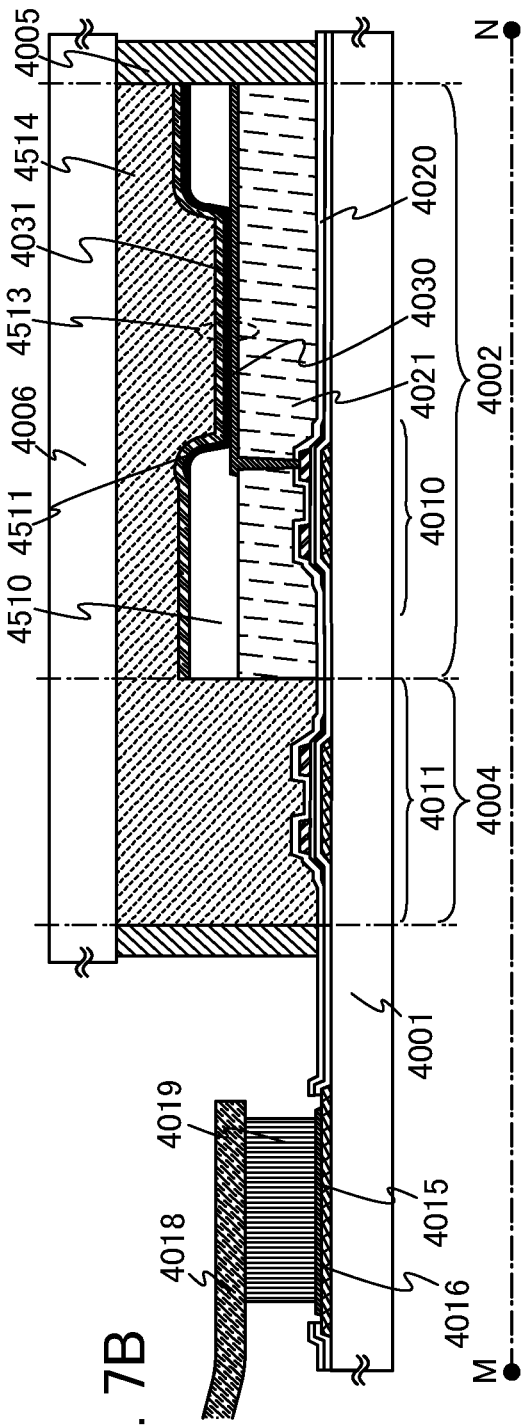
FIG. 7A
FIG. 7B

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the semiconductor device.

In this specification, a semiconductor device means all types of devices which can function by utilizing semiconductor characteristics, and an electro-optical device, a semiconductor circuit, and an electronic device are all semiconductor devices.

2. Description of the Related Art

A technique by which a transistor is formed using a semiconductor thin film formed over a substrate having an insulating surface has been attracting attention. Such a transistor is applied to a wide range of electronic devices such as an integrated circuit (IC) and an image display device (also simply referred to as a display device). A silicon-based semiconductor material is widely known as a material for a semiconductor thin film applicable to a transistor. As another material, an oxide semiconductor has been attracting attention.

For example, a transistor formed using a semiconductor layer which includes an amorphous oxide containing indium (In), gallium (Ga), and zinc (Zn) (IGZO-based amorphous oxide) is disclosed (see Patent Document 1).

REFERENCE

[Patent Document 1] Japanese Published Patent Application No. 2011-181801

SUMMARY OF THE INVENTION

Improvement in reliability is important for commercialization of semiconductor devices including transistors formed using an oxide semiconductor.

However, a semiconductor device includes a plurality of thin films complicatedly stacked, and is manufactured using a variety of materials, methods, and steps. Therefore, an employed manufacturing process may cause shape defects or degradation of electric characteristics of a semiconductor device which is to be provided.

In view of the above problem, an object of one embodiment of the present invention is to provide a highly reliable semiconductor device which includes a transistor formed using an oxide semiconductor.

Another object of one embodiment of the present invention is to manufacture a highly reliable semiconductor device with a high yield to achieve high productivity.

In a semiconductor device including a bottom-gate transistor, an element contained in an etching gas used for formation of a source electrode layer and a drain electrode layer which are provided over and in contact with an oxide semiconductor film is prevented from remaining as an impurity on a surface of the oxide semiconductor film. Specifically, the following embodiment can be employed, for example.

One embodiment of the present invention is a method for manufacturing a semiconductor device, including the steps of forming a gate electrode layer over an insulating surface; forming a gate insulating film over the gate electrode layer; forming an island-shaped oxide semiconductor film over the gate electrode layer with the gate insulating film interposed therebetween; forming a conductive film over the gate insulating film and the island-shaped oxide semiconductor film; processing the conductive film by plasma treatment using an etching gas containing a halogen element, so that a source electrode layer and a drain electrode layer are formed; and performing impurity removal treatment on the oxide semiconductor film to remove the element contained in the etching gas.

In the method for manufacturing a semiconductor device, after the impurity removal treatment, a surface of the oxide semiconductor film preferably has a halogen element concentration (e.g., chlorine concentration) lower than or equal to $5 \times 10^{18}$ atoms/cm$^3$, further preferably lower than or equal to $1 \times 10^{18}$ atoms/cm$^3$.

In the method for manufacturing a semiconductor device, oxygen plasma treatment or dinitrogen monoxide plasma treatment is preferably performed as the impurity removal treatment. Further or alternatively, cleaning treatment using a dilute hydrofluoric acid solution is preferably performed.

A semiconductor device of one embodiment of the present invention includes a gate electrode layer provided over an insulating surface, a gate insulating film provided over the gate electrode layer, an island-shaped oxide semiconductor film provided over the gate insulating film, and a source electrode layer and a drain electrode layer which are provided in contact with the oxide semiconductor film. The source electrode layer and the drain electrode layer cover end portions of the oxide semiconductor film in a channel width direction. A surface of the oxide semiconductor film has a halogen element concentration (e.g., chlorine concentration) lower than or equal to $5 \times 10^{18}$ atoms/cm$^3$.

In the oxide semiconductor film in the above structure, a region overlapping with the source electrode layer or the drain electrode layer has a larger thickness than a region overlapping with neither the source electrode layer nor the drain electrode layer.

As described above, plasma treatment using an etching gas containing a halogen element is favorably employed for pattern formation of a film which is over and in contact with an oxide semiconductor film, such as a source electrode layer or a drain electrode layer. However, if the oxide semiconductor film is exposed to the etching gas containing a halogen element, the halogen element (e.g., chlorine or fluorine) contained in the etching gas extracts oxygen in the oxide semiconductor film in some cases, which might cause an oxygen vacancy to be formed in the vicinity of an interface of the oxide semiconductor film. Further, if the halogen element contained in the etching gas remains on a surface of the oxide semiconductor film and in the vicinity thereof after the etching step, an oxygen vacancy might be formed in the oxide semiconductor film. Such an oxygen vacancy in the oxide semiconductor film might cause a backchannel of the oxide semiconductor film to have lower resistance (n-type conductivity), resulting in formation of a parasitic channel.

For example, in the case where an oxide semiconductor material containing indium is used for the oxide semiconductor film and an etching gas containing boron trichloride ($BCl_3$) is used for processing the source electrode layer and the drain electrode layer which are provided in contact with the oxide semiconductor film, an In—O—In bond in the oxide semiconductor film and Cl contained in the etching gas sometimes react with each other, so that a film including an In—Cl bond and an In element from which oxygen is detached may be formed. Since the In element from which oxygen is detached has a dangling bond, an oxygen vacancy exists in the portion of the oxide semiconductor film, from which oxygen is detached.

Further, in the case where the etching gas containing a halogen element also contains an element (e.g., boron) that is not halogen, the element that is not halogen can cause the backchannel of the oxide semiconductor film to have lower resistance (n-type conductivity).

According to one embodiment of the present invention, after the source electrode layer and the drain electrode layer which are provided over the oxide semiconductor film are formed by etching processing, impurity removal treatment is performed; thus, impurities that can cause the oxide semiconductor film to have lower resistance are removed. Accordingly, the reliability of the semiconductor device can be improved.

One embodiment of the present invention relates to a semiconductor device including a transistor or a semiconductor device including a circuit including a transistor. For example, one embodiment of the present invention relates to a semiconductor device including a transistor in which a channel formation region is formed using an oxide semiconductor or a semiconductor device including a circuit including such a transistor. For example, one embodiment of the present invention relates to an electronic device which includes, as a component, a semiconductor integrated circuit including an LSI, a CPU, a power device mounted on a power supply circuit, a memory, a thyristor, a converter, an image sensor, or the like, an electro-optical device typified by a liquid crystal display panel, or a light-emitting display device including a light-emitting element.

A highly reliable semiconductor device which includes a transistor formed using an oxide semiconductor can be provided.

Further, a highly reliable semiconductor device can be manufactured with a high yield, so that high productivity can be achieved.

BRIEF DESCRIPTION OF THE DRAWINGS

In the accompanying drawings:

FIGS. 7A and 7B are cross-sectional views each illustrating one embodiment of a semiconductor device;

DETAILED DESCRIPTION OF THE INVENTION

Hereinafter, embodiments and examples of the invention disclosed in this specification will be described in detail with reference to the accompanying drawings. Note that the invention disclosed in this specification is not limited to the following description, and it is easily understood by those skilled in the art that modes and details of the invention can be variously changed. Therefore, the invention disclosed in this specification is not construed as being limited to the description in the following embodiments and examples. Note that the ordinal numbers such as "first" and "second" are used for convenience and do not denote the order of steps and the stacking order of layers. In addition, the ordinal numbers in this specification do not denote particular names which specify the invention.

Embodiment 1

In this embodiment, one embodiment of a semiconductor device and a method for manufacturing the semiconductor device are described with reference to FIGS. 1A to 1D and FIGS. 2A to 2E. In this embodiment, a transistor including an oxide semiconductor film is described as an example of the semiconductor device.

The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned above and below a channel formation region with a gate insulating film provided therebetween.

Figure 1A:
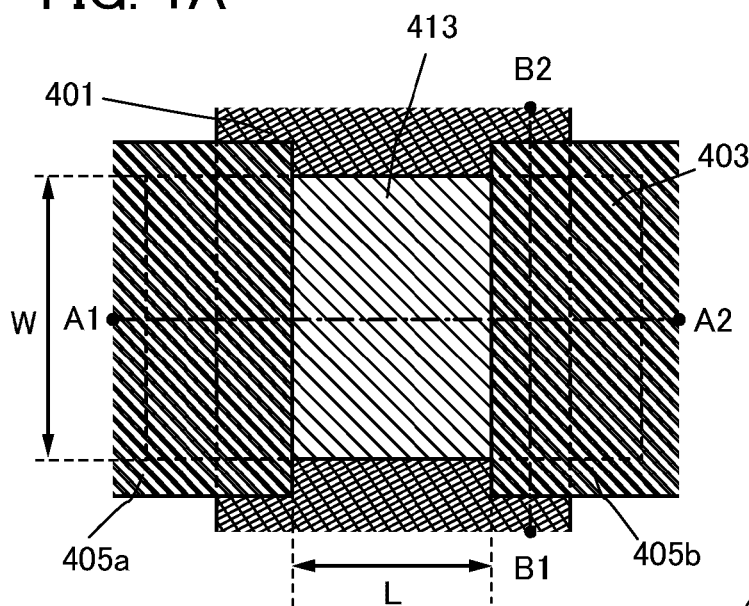
FIGS. 1A to 1D are a plan view and cross-sectional views which illustrate embodiments of a semiconductor device.
Figure 1C:
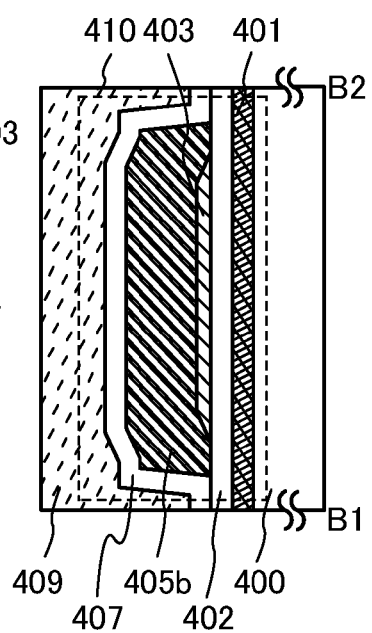
Figure 1B:
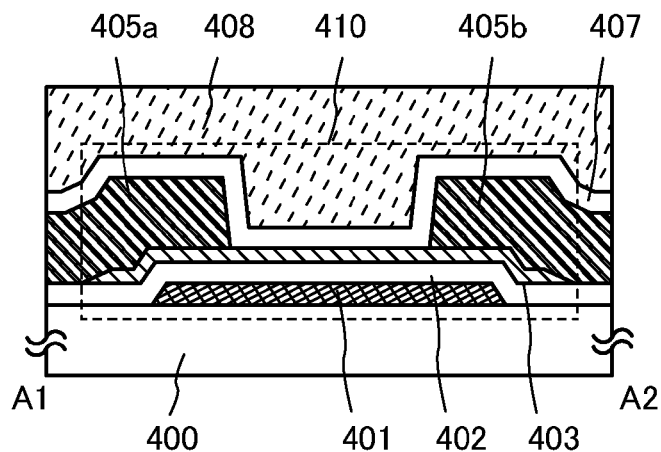

A transistor 410 illustrated in FIGS. 1A to 1C is an example of a transistor which is one of bottom-gate transistors and is also referred to as an inverted-staggered transistor. FIG. 1A is a plan view of the transistor 410, FIG. 1B is a cross-sectional view along line A1-A2 in FIG. 1A (cross-sectional view in the channel length direction), and FIG. 1C is a cross-sectional view along line B1-B2 in FIG. 1A (cross-sectional view in the channel width direction). In FIG. 1A, L represents the channel length and W represents the channel width. Note that, in FIG. 1A, some components of the transistor 410 (e.g., a gate insulating film 402) are not illustrated for brevity.

As illustrated in FIGS. 1A to 1C, the semiconductor device including the transistor 410 includes, over a substrate 400 having an insulating surface, a gate electrode layer 401, the gate insulating film 402, an oxide semiconductor film 403, a source electrode layer 405a, and a drain electrode layer 405b. Further, an insulating film 407 covering the transistor 410 and a planarization insulating film 408 are provided.

In the transistor 410 illustrated in FIGS. 1A to 1C, the halogen element concentration (e.g., chlorine concentration) at an interface between the oxide semiconductor film 403 and the insulating film 407 is reduced to be lower than or equal to $5\times10^{18}$ atoms/cm$^3$, preferably lower than or equal to $1\times10^{18}$ atoms/cm$^3$. Thus, a backchannel of the transistor 410 is prevented from having lower resistance (n-type conductivity), so that formation of a parasitic channel can be prevented in the transistor 410. Accordingly, the reliability of the transistor 410 can be improved.

Further, as illustrated in FIGS. 1A and 1C, the source electrode layer 405a and the drain electrode layer 405b of the transistor 410 cover end portions of the oxide semiconductor film 403 in the channel width W direction. With such a structure, when the source electrode layer 405a and the drain electrode layer 405b are formed, the end portions of the oxide semiconductor film 403 can be prevented from being exposed to plasma generated using an etching gas containing a halogen element.

Figure 1D:
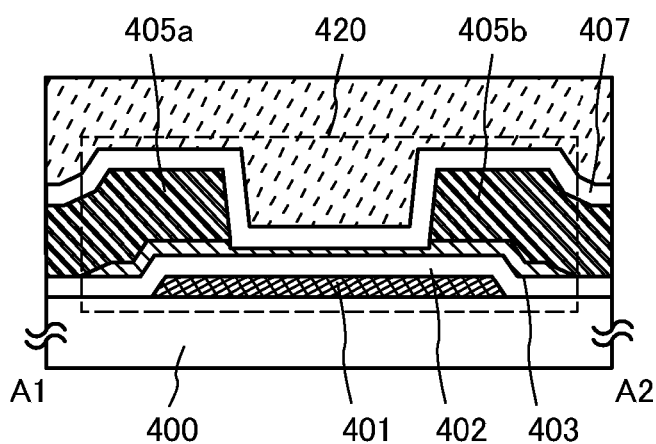

Note that part of the oxide semiconductor film 403 is removed in the formation of the source electrode layer 405a and the drain electrode layer 405b in some cases, so that the oxide semiconductor film 403 may have a groove (depression). Moreover, in some cases, part of the oxide semiconductor film 403 is removed in an impurity removal step (described later in detail) performed after the formation of the source electrode layer 405a and the drain electrode layer 405b, so that the oxide semiconductor film 403 may have a groove (depression). In these cases, a transistor 420 which includes the oxide semiconductor film 403 having a groove (depression) is formed as illustrated in FIG. 1D. Note that a cross-sectional view of the transistor 420 in the channel width W direction (cross-sectional view along line B1-B2 in FIG. 1A) is similar to FIG. 1C.

An oxide semiconductor used for the oxide semiconductor film 403 contains at least indium (In). In particular, In and zinc (Zn) are preferably contained. In addition, as a stabilizer for reducing variation in electric characteristics of a transistor formed using the oxide semiconductor film, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, any of the following can be used: indium oxide, tin oxide, zinc oxide, an In—Zn-based oxide, an In—Mg-based oxide, an In—Ga-based oxide, an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an "In—Ga—Zn-based oxide" means an oxide containing In, Ga, and Zn as main components and there is no limitation on the ratio of In, Ga, and Zn. The In—Ga—Zn-based oxide may contain a metal element other than In, Ga, and Zn.

As the oxide semiconductor, a material represented by $InMO_3(ZnO)_m$ (m>0, m is not an integer) may be used. Note that M represents one or more metal elements selected from Ga, Fe, Mn, and Co. Alternatively, a material represented by $In_2SnO_5(ZnO)_n$ (n>0, n is an integer) may be used as the oxide semiconductor.

For example, an In—Ga—Zn-based oxide with an atomic ratio of In:Ga:Zn=1:1:1 (=1/3:1/3:1/3), In:Ga:Zn=2:2:1 (=2/5:2/5:1/5), or In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition of the oxide semiconductor containing indium is not limited to the compositions given above, and a material having an appropriate composition may be used in accordance with needed semiconductor characteristics (e.g., mobility, threshold voltage, and variation). In order to obtain the needed semiconductor characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily in the case of a transistor formed using an In—Sn—Zn-based oxide. Also in the case of a transistor formed using an In—Ga—Zn-based oxide, the mobility can be increased by reducing the defect density in a bulk.

Note that, for example, the expression "the composition of an oxide containing In, Ga, and Zn at an atomic ratio of In:Ga:Zn=a:b:c (a+b+c=1) is in the neighborhood of the composition of an oxide containing In, Ga, and Zn at an atomic ratio of In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor film 403 is in a single crystal state, a polycrystalline (also referred to as polycrystal) state, an amorphous state, or the like.

The oxide semiconductor film 403 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase. Note that, in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a decrease in electron mobility due to the grain boundary is suppressed.

In each of the crystal parts included in the CAAC-OS film, a c-axis is aligned in a direction parallel to a normal vector of a surface where the CAAC-OS film is formed or a normal vector of a surface of the CAAC-OS film, a triangular or hexagonal atomic arrangement is formed when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to the normal vector of the surface where the CAAC-OS film is formed or the normal vector of the surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that, when the CAAC-OS film is formed, the direction of the c-axis of the crystal part is the direction parallel to the normal vector of the surface where the CAAC-OS film is formed or the normal vector of the surface of the CAAC-OS film. The crystal part is formed by film formation or by performing treatment for crystallization such as heat treatment after film formation.

With the use of the CAAC-OS film in a transistor, change in electric characteristics of the transistor due to irradiation with visible light or ultraviolet light can be reduced. Thus, the transistor has high reliability.

Note that part of oxygen contained in the oxide semiconductor film may be substituted with nitrogen.

In an oxide semiconductor having a crystal part such as the CAAC-OS, defects in the bulk can be further reduced and when the surface flatness of the oxide semiconductor is improved, mobility higher than that of an amorphous oxide semiconductor can be obtained. In order to improve the surface flatness, the oxide semiconductor is preferably formed on a flat surface. Specifically, the oxide semiconductor is preferably formed on a surface with an average surface roughness ($R_a$) less than or equal to 1 nm, further preferably less than or equal to 0.3 nm, still further preferably less than or equal to 0.1 nm.

Note that $R_a$ is obtained by expanding arithmetic mean average roughness, which is defined by JIS B 0601:2001 (ISO4287:1997), into three dimensions so as to be applicable to a curved surface. The $R_a$ can be expressed as an "average value of the absolute values of deviations from a reference surface to a specific surface" and is defined by the following formula.

$$Ra = \frac{1}{S_0} \int_{y_1}^{y_2} \int_{x_1}^{x_2} |f(x, y) - Z_0| dx dy \quad \text{[FORMULA 1]}$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). Moreover, $S_0$ represents the area of a rectangle which is obtained by projecting the specific surface on the x-y plane, and $Z_0$ represents the height of the reference surface (the average height of the specific surface). Further, $R_a$ can be measured using an atomic force microscope (AFM).

Note that, since the transistor 410 described in this embodiment is a bottom-gate transistor, the substrate 400, the gate electrode layer 401, and the gate insulating film 402 are located below the oxide semiconductor film. Accordingly, planarization treatment such as CMP treatment may be performed after the formation of the gate electrode layer 401 and the gate insulating film 402 to obtain the above flat surface.

The oxide semiconductor film 403 has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a CVD method, a pulsed laser deposition method, an atomic layer deposition (ALD) method, or the like as appropriate. The oxide semiconductor film 403 may be formed using a sputtering apparatus which performs film formation with surfaces of a plurality of substrates set substantially perpendicular to a surface of a sputtering target.

Next, FIGS. 2A to 2E illustrate an example of a method for manufacturing the semiconductor device including the transistor 410.

There is no particular limitation on a substrate that can be used as the substrate 400 having an insulating surface as long as it has heat resistance high enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400. Alternatively, any of these substrates provided with a semiconductor element may be used as the substrate 400.

The semiconductor device may be manufactured using a flexible substrate as the substrate 400. In order to manufacture a flexible semiconductor device, the transistor 410 including the oxide semiconductor film 403 may be directly formed over a flexible substrate. Alternatively, the transistor 410 including the oxide semiconductor film 403 may be formed over a manufacturing substrate, and then the transistor 410 may be separated from the manufacturing substrate and transferred to a flexible substrate. Note that, in order to separate the transistor 410 including the oxide semiconductor film from the manufacturing substrate and transfer it to the flexible substrate, a separation layer may be provided between the manufacturing substrate and the transistor.

As a base film, an insulating film may be provided over the substrate 400. The insulating film can be formed by a plasma CVD method, a sputtering method, or the like, using an oxide insulating material such as silicon oxide, silicon oxynitride, aluminum oxide, aluminum oxynitride, hafnium oxide, or gallium oxide; a nitride insulating material such as silicon nitride, silicon nitride oxide, aluminum nitride, or aluminum nitride oxide; or a mixed material of any of these materials.

The substrate 400 (or the substrate 400 and the insulating film) may be subjected to heat treatment. For example, the heat treatment may be performed with a gas rapid thermal annealing (GRTA) apparatus, in which heat treatment is performed using a high-temperature gas, at 650° C. for 1 minute to 5 minutes. As the high-temperature gas for GRTA, an inert gas which does not react with an object to be processed by heat treatment, such as nitrogen or a rare gas like argon, is used. Alternatively, the heat treatment may be performed with an electric furnace at 500° C. for 30 minutes to 1 hour.

Next, a conductive film which is to be a gate electrode layer (including a wiring formed using the same layer as the gate electrode layer) is formed over the substrate 400. The conductive film can be formed using a metal material such as molybdenum, titanium, tantalum, tungsten, aluminum, copper, chromium, neodymium, or scandium, or an alloy material containing any of these materials as a main component. Alternatively, a semiconductor film typified by a polycrystalline silicon film doped with an impurity element such as phosphorus, or a silicide film such as a nickel silicide film may be used as the conductive film. The conductive film may have a single-layer structure or a stacked structure.

The conductive film can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. The conductive film can have a stacked structure of the above conductive material and the above metal material.

As the conductive film, which is to be in contact with the gate insulating film 402, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (InN, SnN, or the like) film can be used. These films each have a work function of 5 eV or higher, preferably 5.5 eV or higher. In the case where any of these films is used for the gate electrode layer, the threshold voltage, which is one of electric characteristics of a transistor, can be positive; accordingly, a normally-off switching element can be provided.

In this embodiment, a 100-nm-thick tungsten film is formed by a sputtering method.

Next, through a photolithography process, a resist mask is formed over the conductive film and selective etching is performed, so that the gate electrode layer 401 is formed. After the gate electrode layer 401 is formed, the resist mask is removed. The etching of the conductive film may be dry etching, wet etching, or both dry etching and wet etching.

After the formation of the gate electrode layer 401, the substrate 400 and the gate electrode layer 401 may be subjected to heat treatment. For example, the heat treatment may be performed with a GRTA apparatus at 650° C. for 1 minute to 5 minutes. Alternatively, the heat treatment may be performed with an electric furnace at 500° C. for 30 minutes to 1 hour.

Next, the gate insulating film 402 is formed over the gate electrode layer 401.

To improve the coverage with the gate insulating film 402, planarization treatment may be performed on a surface of the gate electrode layer 401. It is preferable that the flatness of the surface of the gate electrode layer 401 be good particularly when the thickness of the gate insulating film 402 is small.

The gate insulating film 402 has a thickness greater than or equal to 1 nm and less than or equal to 20 nm and can be formed by a sputtering method, an MBE method, a CVD method, a PECVD method, a pulsed laser deposition method, an ALD method, or the like as appropriate. The gate insulating film 402 may be formed using a sputtering apparatus which performs film formation with surfaces of a plurality of substrates set substantially perpendicular to a surface of a sputtering target.

The gate insulating film 402 can be formed using silicon oxide, gallium oxide, aluminum oxide, silicon nitride, silicon oxynitride, aluminum oxynitride, or silicon nitride oxide. When the gate insulating film 402 is formed using a high-k material such as hafnium oxide, yttrium oxide, hafnium silicate (HfSi$_x$O$_y$ (x>0, y>0)), hafnium silicate to which nitrogen is added (HfSiO$_x$N$_y$ (x>0, y>0)), hafnium aluminate (HfAl$_x$O$_y$ (x>0, y>0)), or lanthanum oxide, gate leakage current can be reduced. In addition, the gate insulating film 402 is formed to have a single-layer structure or a stacked structure using any of the above materials.

It is preferable that the gate insulating film 402 contain oxygen in a portion which is in contact with the oxide semiconductor film 403. In particular, the gate insulating film 402 preferably contains oxygen at least in excess of the stoichiometric composition in (a bulk of) the film. For example, in the case where a silicon oxide film is used as the gate insulating film 402, the composition formula is SiO$_{2+\alpha}$ ($\alpha$>0).

When the gate insulating film 402 containing much (excess) oxygen, which serves as an oxygen supply source, is provided in contact with the oxide semiconductor film 403, oxygen can be supplied from the gate insulating film 402 to the oxide semiconductor film 403. Heat treatment may be performed in the state where the oxide semiconductor film 403 and the gate insulating film 402 are in contact with each other at least partly to supply oxygen to the oxide semiconductor film 403.

By supply of oxygen to the oxide semiconductor film 403, oxygen vacancies in the film can be repaired. Further, the gate insulating film 402 is preferably formed in consideration of the size of a transistor to be formed and the step coverage with the gate insulating film 402.

In this embodiment, a 200-nm-thick silicon oxynitride film is formed by a high-density plasma CVD method.

After the formation of the gate insulating film 402, the substrate 400, the gate electrode layer 401, and the gate insulating film 402 may be subjected to heat treatment. For example, the heat treatment may be performed with a GRTA apparatus at 650° C. for 1 minute to 5 minutes. Alternatively, the heat treatment may be performed with an electric furnace at 500° C. for 30 minutes to 1 hour.

Figure 2A:
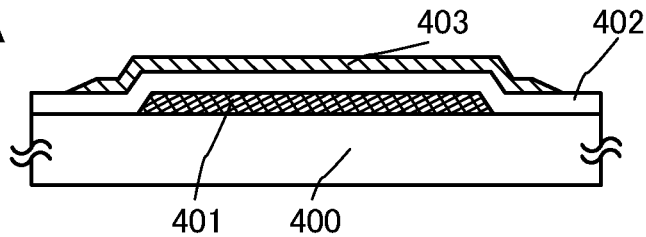
FIGS. 2A to 2E are cross-sectional views illustrating one embodiment of a method for manufacturing a semiconductor device.

Next, the oxide semiconductor film 403 is formed over the gate insulating film 402 (see FIG. 2A).

To prevent the oxide semiconductor film 403 from containing hydrogen or water as much as possible in the step for forming the oxide semiconductor film 403, it is preferable to preheat the substrate provided with the gate insulating film 402 in a preheating chamber of a sputtering apparatus as pretreatment for formation of the oxide semiconductor film 403 so that impurities such as hydrogen and moisture adsorbed to the substrate and the gate insulating film 402 are eliminated and removed. As an evacuation unit provided in the preheating chamber, a cryopump is preferable.

Planarization treatment may be performed on a region which is in the gate insulating film 402 and in contact with the oxide semiconductor film 403. The planarization treatment may be, but not particularly limited to, polishing treatment (e.g., chemical mechanical polishing (CMP)), dry etching treatment, or plasma treatment.

As the plasma treatment, for example, reverse sputtering in which an argon gas is introduced and plasma is generated can be performed. The reverse sputtering is a method in which voltage is applied to a substrate side with the use of an RF power source in an argon atmosphere and plasma is generated in the vicinity of the substrate so that a surface is modified. Note that, instead of an argon atmosphere, a nitrogen atmosphere, a helium atmosphere, an oxygen atmosphere, or the like may be used. The reverse sputtering can remove particle substances (also referred to as particles or dust) attached to the surface of the gate insulating film 402.

As the planarization treatment, polishing treatment, dry etching treatment, or plasma treatment may be performed plural times, or these treatments may be performed in combination. In the case where the treatments are combined, the order of steps is not particularly limited and may be set as appropriate in accordance with the roughness of the surface of the gate insulating film 402.

The oxide semiconductor film 403 is preferably formed under a condition such that much oxygen is contained (e.g., by a sputtering method in a 100% oxygen atmosphere) so as to be a film containing much oxygen (preferably a film including a region where oxygen is contained in excess of that in the stoichiometric composition of the oxide semiconductor in a crystalline state).

In this embodiment, a 35-nm-thick In—Ga—Zn-based oxide film (IGZO film) is formed as the oxide semiconductor film 403 by a sputtering method using a sputtering apparatus including an AC power supply device. In this embodiment, an In—Ga—Zn-based oxide target having an atomic ratio of In:Ga:Zn=1:1:1 (=1/3:1/3:1/3) is used. Note that the film formation condition is as follows: the atmosphere is an atmosphere of oxygen and argon (oxygen flow rate: 50%), the pressure is 0.6 Pa, the power of the power source is 5 kW, and the substrate temperature is 170° C. The deposition rate under the film formation condition is 16 nm/min.

It is preferable that a high-purity gas from which impurities such as hydrogen, water, a hydroxyl group, and hydride are removed be used as a sputtering gas for the formation of the oxide semiconductor film 403.

The substrate is held in a deposition chamber kept under reduced pressure. Then a sputtering gas from which hydrogen and moisture are removed is introduced while moisture remaining in the deposition chamber is removed, and the oxide semiconductor film 403 is formed over the substrate 400 with the use of the above target. In order to remove moisture remaining in the deposition chamber, an entrapment vacuum pump such as a cryopump, an ion pump, or a titanium sublimation pump is preferably used. As an evacuation unit, a turbo molecular pump provided with a cold trap may be used. From the deposition chamber which is evacuated with a cryopump, a hydrogen atom, a compound containing a hydrogen atom, such as water ($H_2O$), (preferably also a compound containing a carbon atom), and the like are removed, whereby the concentration of an impurity such as hydrogen, water, a hydroxyl group, or hydride in the oxide semiconductor film 403 formed in the deposition chamber can be reduced.

It is preferable to form the gate insulating film 402 and the oxide semiconductor film 403 in succession so as not to expose the gate insulating film 402 to the air. Forming the gate insulating film 402 and the oxide semiconductor film 403 in succession so as not to expose the gate insulating film 402 to the air can prevent impurities such as hydrogen and moisture from being adsorbed to the surface of the gate insulating film 402.

The oxide semiconductor film 403 can be formed by processing an oxide semiconductor film into an island shape through a photolithography process.

A resist mask for forming the island-shaped oxide semiconductor film 403 may be formed by an inkjet method. Formation of the resist mask by an inkjet method needs no photomask; thus, manufacturing cost can be reduced.

Note that etching of the oxide semiconductor film may be dry etching, wet etching, or both dry etching and wet etching. As an etchant used for wet etching of the oxide semiconductor film, for example, a mixed solution of phosphoric acid, acetic acid, and nitric acid can be used. Alternatively, ITO-07N (produced by KANTO CHEMICAL CO., INC.) may be used. It is also possible to employ dry etching using an inductively coupled plasma (ICP) etching method.

Further, heat treatment may be performed on the oxide semiconductor film 403 in order to remove excessive hydrogen (including water and a hydroxyl group) (to perform dehydration or dehydrogenation). The temperature of the heat treatment is higher than or equal to 300° C. and lower than or equal to 700° C. or lower than the strain point of the substrate. The heat treatment can be performed under reduced pressure, in a nitrogen atmosphere, or the like.

When a crystalline oxide semiconductor film is used as the oxide semiconductor film 403, heat treatment for crystallization may be performed.

In this embodiment, the substrate is introduced into an electric furnace, which is one of heat treatment apparatuses, and the oxide semiconductor film 403 is subjected to heat treatment at 450° C. in a nitrogen atmosphere for 1 hour and further at 450° C. in an atmosphere of nitrogen and oxygen for 1 hour.

Note that a heat treatment apparatus is not limited to an electric furnace, and an apparatus for heating an object to be processed by heat conduction or heat radiation from a heating element such as a resistance heating element may be used. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows. The substrate is put in an inert gas heated to a high temperature of 650° C. to 700° C., is heated for several minutes, and is taken out of the inert gas.

Note that, in the heat treatment, it is preferable that water, hydrogen, and the like be not contained in nitrogen or a rare gas such as helium, neon, or argon. The purity of nitrogen or the rare gas such as helium, neon, or argon which is introduced into the heat treatment apparatus is preferably 6N (99.9999%) or higher, further preferably 7N (99.99999%) or higher (i.e., the impurity concentration is preferably 1 ppm or lower, further preferably 0.1 ppm or lower).

In addition, after the oxide semiconductor film 403 is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, further preferably less than or equal to 10 ppb, according to measurement with a dew point meter of a cavity ring down laser spectroscopy (CRDS) system) may be introduced into the same furnace. It is preferable that water, hydrogen, and the like be not contained in the oxygen gas or the dinitrogen monoxide gas. The purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). By the effect of the oxygen gas or the dinitrogen monoxide gas, oxygen, which is a main constituent material of the oxide semiconductor and has been decreased through the step for removing impurities by dehydration or dehydrogenation treatment, is supplied. Consequently, the oxide semiconductor film 403 can be highly purified and made i-type (intrinsic).

Note that the timing of the heat treatment for dehydration or dehydrogenation may be after formation of the oxide semiconductor film or after formation of the island-shaped oxide semiconductor film 403.

The heat treatment for dehydration or dehydrogenation may be performed plural times, and may also serve as another heat treatment.

When the heat treatment for dehydration or dehydrogenation is performed in the state where the gate insulating film 402 is covered with the oxide semiconductor film which has not been processed into the island-shaped oxide semiconductor film 403, oxygen contained in the gate insulating film 402 can be prevented from being released by the heat treatment, which is preferable.

Further or alternatively, oxygen (which includes at least one of an oxygen radical, an oxygen atom, and an oxygen ion) may be introduced into the dehydrated or dehydrogenated oxide semiconductor film 403 in order to supply oxygen to the film.

The dehydration or dehydrogenation treatment might be accompanied by detachment and decrease of oxygen, which is a main constituent material of the oxide semiconductor. In the oxide semiconductor film, an oxygen vacancy exists in a portion from which oxygen is detached and a donor level which leads to change in electric characteristics of a transistor is formed owing to the oxygen vacancy.

Therefore, it is preferable that oxygen (which includes at least one of an oxygen radical, an oxygen atom, and an oxygen ion) be supplied to the dehydrated or dehydrogenated oxide semiconductor film. By supply of oxygen to the oxide semiconductor film, oxygen vacancies in the film can be repaired.

Introduction of oxygen into the dehydrated or dehydrogenated oxide semiconductor film 403 enables the oxide semiconductor film 403 to be highly purified and i-type (intrinsic). Change in electric characteristics of the transistor including the highly purified i-type (intrinsic) oxide semiconductor film 403 is suppressed, and the transistor is electrically stable.

Oxygen can be introduced by an ion implantation method, an ion doping method, a plasma immersion ion implantation method, plasma treatment, or the like.

In the case where oxygen is introduced into the oxide semiconductor film 403, oxygen may be directly introduced into the oxide semiconductor film 403, or may be introduced into the oxide semiconductor film 403 through another film such as the insulating film 407 formed later. An ion implantation method, an ion doping method, a plasma immersion ion implantation method, or the like may be employed for the introduction of oxygen through another film, whereas plasma treatment or the like can also be employed for the direct introduction of oxygen into the exposed oxide semiconductor film 403.

The introduction of oxygen into the oxide semiconductor film 403 is preferably performed, but not particularly limited to, after the dehydration or dehydrogenation treatment. Further, oxygen may be introduced plural times into the dehydrated or dehydrogenated oxide semiconductor film 403.

It is preferable that the oxide semiconductor film in the transistor include a region where oxygen is contained in excess of that in the stoichiometric composition of the oxide semiconductor in a crystalline state. In this case, the amount of oxygen is substantially larger than that in the stoichiometric composition of the oxide semiconductor. Alternatively, the amount of oxygen is substantially larger than that in the oxide semiconductor in a single crystal state. In some cases, oxygen may exist between lattices of the oxide semiconductor.

By removing hydrogen or moisture from the oxide semiconductor to highly purify the oxide semiconductor so as not to contain impurities as much as possible and supplying oxygen to repair oxygen vacancies therein, the oxide semiconductor can be turned into an i-type (intrinsic) oxide semiconductor or a substantially i-type (intrinsic) oxide semiconductor. This enables the Fermi level ($E_f$) of the oxide semiconductor to be at the same level as the intrinsic Fermi level ($E_i$). Accordingly, by using the oxide semiconductor film for a transistor, variation in the threshold voltage $V_{th}$ of the transistor due to an oxygen vacancy and a shift of the threshold voltage $\Delta V_{th}$ can be reduced.

Figure 2B:
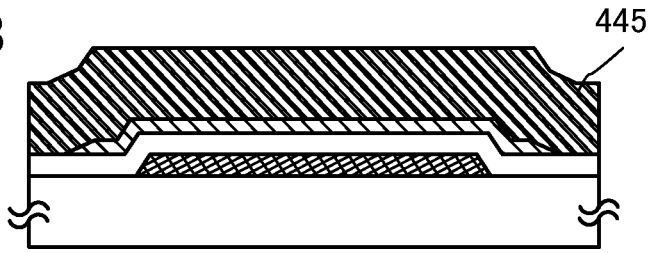

Next, a conductive film 445 which is to be a source electrode layer and a drain electrode layer (including a wiring formed using the same layer as the source electrode layer and the drain electrode layer) is formed over the gate electrode layer 401, the gate insulating film 402, and the oxide semiconductor film 403 (see FIG. 2B).

The conductive film 445 is formed of a material that can withstand heat treatment performed later. As the conductive film 445 used for the source electrode layer and the drain electrode layer, for example, a metal film containing an element selected from aluminum (Al), chromium (Cr), copper (Cu), tantalum (Ta), titanium (Ti), molybdenum (Mo), and tungsten (W) or a metal nitride film containing any of the above elements as a component (e.g., a titanium nitride film, a molybdenum nitride film, or a tungsten nitride film) can be used. A film of a high-melting-point metal such as titanium (Ti), molybdenum (Mo), or tungsten (W) or a metal nitride film thereof (e.g., a titanium nitride film, a molybdenum nitride film, or a tungsten nitride film) may be stacked on one or both of a bottom side and a top side of a metal film of aluminum (Al), copper (Cu), or the like. Alternatively, the conductive film 445 used for the source electrode layer and the drain electrode layer may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, abbreviated to ITO), indium oxide-zinc oxide ($In_2O_3$—ZnO), or any of these metal oxide materials containing silicon oxide can be used.

Figure 2C:
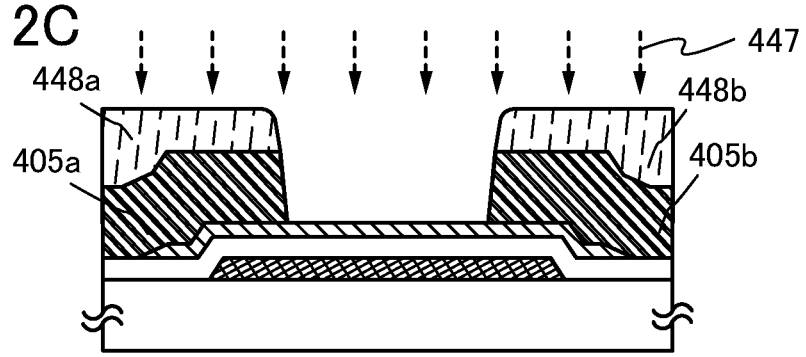

Through a photolithography process, a resist mask 448a and a resist mask 448b are formed over the conductive film 445 and selective etching is performed, so that the source electrode layer 405a and the drain electrode layer 405b are formed (see FIG. 2C). After the source electrode layer 405a and the drain electrode layer 405b are formed, the resist masks 448a and 448b are removed.

Ultraviolet light, KrF laser light, or ArF laser light is preferably used for light exposure for forming the resist masks 448a and 448b. The channel length L of the transistor 410 completed later is determined by the distance between a lower edge of the source electrode layer 405a and a lower edge of the drain electrode layer 405b, which are adjacent to each other over the oxide semiconductor film 403. In the case where the channel length L is less than 25 nm, the light exposure for forming the resist masks 448a and 448b is preferably performed using extreme ultraviolet light having an extremely short wavelength of several nanometers to several tens of nanometers. In the light exposure with extreme ultraviolet light, the resolution is high and the focus depth is large. For these reasons, the channel length L of the transistor completed later can be greater than or equal to 10 nm and less than or equal to 1000 nm, and the operation speed of a circuit can increased.

In order to reduce the number of photomasks used in a photolithography process and the number of steps, an etching step may be performed with the use of a resist mask formed using a multi-tone mask which is a light-exposure mask through which light is transmitted to have a plurality of intensities. A resist mask formed using a multi-tone mask has a plurality of thicknesses and further can be changed in shape by etching; therefore, the resist mask can be used in a plurality of etching steps for processing into different patterns. Therefore, a resist mask corresponding to at least two kinds of different patterns can be formed by using one multi-tone mask. Thus, the number of light-exposure masks can be reduced and the number of corresponding photolithography processes can be also reduced, whereby the manufacturing process can be simplified.

In this embodiment, a gas 447 containing a halogen element is used for the etching of the conductive film 445. A gas containing chlorine such as a gas containing chlorine ($Cl_2$), boron trichloride ($BCl_3$), silicon tetrachloride ($SiCl_4$), or carbon tetrachloride ($CCl_4$) can be used as the gas 447 containing a halogen element. Alternatively, a gas containing fluorine such as a gas containing carbon tetrafluoride ($CF_4$), sulfur hexafluoride ($SF_6$), nitrogen trifluoride ($NF_3$), or trifluoromethane ($CHF_3$) can be used as the gas 447 containing a halogen element. Alternatively, any of these gases to which a rare gas such as helium (He) or argon (Ar) is added, or the like can be used.

As an etching method, a parallel-plate reactive ion etching (RIE) method or an inductively coupled plasma (ICP) etching method can be used. In order to etch the film into a desired shape, the etching condition (the amount of power applied to a coil-shaped electrode, the amount of power applied to an electrode on a substrate side, the temperature of the electrode on the substrate side, or the like) is adjusted as appropriate.

In this embodiment, a stack of a 100-nm-thick titanium film, a 400-nm-thick aluminum film, and a 100-nm-thick titanium film is formed as the conductive film 445 by a sputtering method. As the etching of the conductive film 445, the stack of the titanium film, the aluminum film, and the titanium film is etched by a dry etching method, whereby the source electrode layer 405a and the drain electrode layer 405b are formed.

In this embodiment, the upper titanium film and the aluminum film are etched under a first etching condition and then the lower titanium film is etched under a second etching condition. The first etching condition is as follows: an etching gas ($BCl_3$:$Cl_2$=750 sccm:150 sccm) is used, the bias power is 1500 W, the power of the ICP power source is 0 W, and the pressure is 2.0 Pa. The second etching condition is as follows: an etching gas ($BCl_3$:$Cl_2$=700 sccm:100 sccm) is used, the bias power is 750 W, the power of the ICP power source is 0 W, and the pressure is 2.0 Pa.

It is preferable that the etching condition for the conductive film 445 be optimized in order to prevent the oxide semiconductor film 403 from being etched to be removed or divided in the etching step of the conductive film 445. However, it is difficult to obtain a condition under which only the conductive film 445 is etched and the oxide semiconductor film 403 is not etched at all. Therefore, in some cases, part of the oxide semiconductor film 403 is removed when the conductive film 445 is etched, so that the oxide semiconductor film 403 may have a groove (depression).

In the case where an etching gas containing a halogen element is used in the etching step for forming the source electrode layer 405a and the drain electrode layer 405b, if the oxide semiconductor film 403 is exposed to the etching gas, the halogen element (e.g., chlorine or fluorine) contained in the etching gas extracts oxygen in the oxide semiconductor film 403 in some cases, which might cause an oxygen vacancy to be formed on a surface of the oxide semiconductor film 403. Further, if the halogen element contained in the etching gas remains on the surface of the oxide semiconductor film 403 and in the vicinity thereof after the etching step, an oxygen vacancy might be formed in the oxide semiconductor film 403. Such an oxygen vacancy in the oxide semiconductor film 403 might cause the backchannel of the oxide semiconductor film 403 to have lower resistance (n-type conductivity), resulting in formation of a parasitic channel.

For example, in the case where an oxide semiconductor material containing indium is used for the oxide semiconductor film 403 and an etching gas containing boron trichloride ($BCl_3$) is used for processing the source electrode layer and the drain electrode layer which are provided in contact with the oxide semiconductor film, an In—O—In bond in the oxide semiconductor film and Cl contained in the etching gas sometimes react with each other, so that a film including an In—Cl bond and an In element from which oxygen is detached may be formed. Since the In element from which oxygen is detached has a dangling bond, an oxygen vacancy exists in the portion of the oxide semiconductor film, from which oxygen is detached.

Further, since the etching gas containing a halogen element may also contain an element (e.g., boron) that is not halogen, the element that is not halogen can cause the backchannel of the oxide semiconductor film to have lower resistance (n-type conductivity).

In this embodiment, since the gas 447 containing a halogen element is used in the etching step for forming the source electrode layer 405a and the drain electrode layer 405b, an impurity to be generated is a halogen-based (in this embodiment, chlorine-based) impurity (a halogen element or a compound containing a halogen element). In addition, in the case where the gas 447 containing a halogen element contains boron as in this embodiment, boron or a compound containing boron may also be generated as an impurity.

Figure 2D:
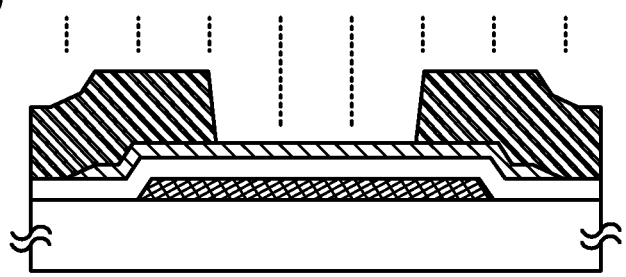

Thus, after the formation of the source electrode layer 405a and the drain electrode layer 405b, a step for removing impurities existing on the surface of the oxide semiconductor film 403 and in the vicinity thereof is performed (see FIG. 2D). For the impurity removal step, plasma treatment using oxygen, dinitrogen monoxide, or a rare gas (typically argon); solution treatment using dilute hydrofluoric acid, water, a developer, or a TMAH solution; or the like can be favorably employed. When an IGZO film is subjected to treatment using dilute hydrofluoric acid, for example, $1/10^3$ dilute hydrofluoric acid (hydrofluoric acid: 0.05%), the thickness decreases by 1 nm to 3 nm per second. When the IGZO film is subjected to treatment using $2/10^5$ dilute hydrofluoric acid (hydrofluoric acid: 0.0025%), the thickness decreases by approximately 0.1 nm per second. By performing the impurity removal treatment on the oxide semiconductor film 403, the chlorine concentration on the surface of the oxide semiconductor film 403 can be reduced to be lower than or equal to $5\times10^{18}$ atoms/cm$^3$, preferably lower than or equal to $1\times10^{18}$ atoms/cm$^3$. In this embodiment, an example in which plasma treatment using dinitrogen monoxide is performed as the impurity removal step is described.

Figure 2E:
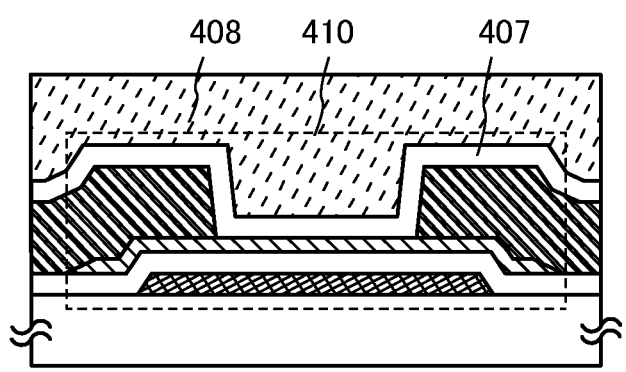

Through the above process, the transistor 410 of this embodiment is formed (see FIG. 2E).

In this embodiment, the insulating film 407 serving as a protective insulating film is formed over the source electrode layer 405a and the drain electrode layer 405b so as to be in contact with the oxide semiconductor film 403.

The insulating film 407 has a thickness of at least 1 nm and can be formed by a method by which impurities such as water and hydrogen do not enter the insulating film 407, such as a sputtering method, as appropriate. When hydrogen is contained in the insulating film 407, entry of the hydrogen into the oxide semiconductor film 403 or extraction of oxygen from the oxide semiconductor film 403 by the hydrogen may occur; thus, the backchannel of the oxide semiconductor film 403 might have lower resistance (n-type conductivity) and a parasitic channel might be formed. Therefore, it is important that a film formation method in which hydrogen is not used be employed so that the insulating film 407 contains as little hydrogen as possible.

The insulating film 407 can have a single-layer structure or a stacked structure including one or more inorganic insulating films, typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film.

Oxygen is preferably supplied to the oxide semiconductor film 403 in the case where a heating step is performed as dehydration or dehydrogenation treatment. By supply of oxygen to the oxide semiconductor film 403, oxygen vacancies in the film can be repaired.

In this embodiment, oxygen is supplied to the oxide semiconductor film 403 using the insulating film 407 as a supply source, and thus, an example in which an oxide insulating film (e.g., a silicon oxide film or a silicon oxynitride film) containing oxygen is used as the insulating film 407 is described. In the case where the insulating film 407 is used as an oxygen supply source, the insulating film 407 can favorably function as the oxygen supply source when being a film containing much (excess) oxygen (preferably a film including a region where oxygen is contained in excess of that in the stoichiometric composition in a crystalline state).

In this embodiment, a 300-nm-thick silicon oxide film is formed as the insulating film 407 by a sputtering method. The substrate temperature in the film formation may be higher than or equal to room temperature and lower than or equal to 300° C., and in this embodiment, is 100° C. The silicon oxide film can be formed by a sputtering method in a rare gas (typically argon) atmosphere, an oxygen atmosphere, or a mixed atmosphere of a rare gas and oxygen. As a target, a silicon oxide target or a silicon target can be used. For example, with the use of a silicon target, a silicon oxide film can be formed by a sputtering method in an atmosphere containing oxygen.

In order to remove moisture remaining in a deposition chamber of the insulating film 407 in a manner similar to that of the formation of the oxide semiconductor film 403, an entrapment vacuum pump (such as a cryopump) is preferably used. When the insulating film 407 is formed in the deposition chamber evacuated using a cryopump, the impurity concentration in the insulating film 407 can be reduced. As an evacuation unit for removing moisture remaining in the deposition chamber of the insulating film 407, a turbo molecular pump provided with a cold trap may be used.

It is preferable to use a high-purity gas from which impurities such as hydrogen and water are removed as a sputtering gas for the formation of the insulating film 407.

Next, the oxide semiconductor film 403, part of which (channel formation region) is in contact with the insulating film 407, is subjected to a heating step.

The heating step is performed at a temperature higher than or equal to 250° C. and lower than or equal to 700° C., or higher than or equal to 400° C. and lower than or equal to 700° C. or lower than the strain point of the substrate. For example, the substrate is introduced into an electric furnace, which is one of heat treatment apparatuses, and the heating step is performed on the oxide semiconductor film at 250° C. in a nitrogen atmosphere for 1 hour.

For the heating step, a heating method and a heating apparatus similar to those for the heating step performed as dehydration or dehydrogenation treatment can be used.

The heating step may be performed under reduced pressure, in a nitrogen atmosphere, in an oxygen atmosphere, in ultra-dry air (the moisture amount is less than or equal to 20 ppm (−55° C. by conversion into a dew point), preferably less than or equal to 1 ppm, further preferably less than or equal to 10 ppb, according to measurement with a dew point meter of a cavity ring down laser spectroscopy (CRDS) system), or in a rare gas (argon, helium, or the like) atmosphere. It is preferable that water, hydrogen, and the like be not contained in the nitrogen atmosphere, the oxygen atmosphere, the ultra-dry air, the rare gas atmosphere, or the like. The purity of nitrogen, oxygen, or the rare gas which is introduced into a heat treatment apparatus is preferably 6N (99.9999%) or higher, further preferably 7N (99.99999%) or higher (i.e., the impurity concentration is preferably 1 ppm or lower, further preferably 0.1 ppm or lower).

The oxide semiconductor film 403 and the insulating film 407 containing oxygen are in contact with each other during the heating step; thus, oxygen, which is one of main constituent materials of the oxide semiconductor film 403 and is decreased through the step for removing impurities, can be supplied from the insulating film 407 containing oxygen to the oxide semiconductor film 403.

Further, a dense inorganic insulating film may be provided over the insulating film 407. For example, an aluminum oxide film is formed over the insulating film 407 by a sputtering method. When the aluminum oxide film has high density (the film density is higher than or equal to 3.2 g/cm$^3$, preferably higher than or equal to 3.6 g/cm$^3$), the transistor 410 can have stable electric characteristics. The film density can be measured by Rutherford backscattering spectrometry (RBS) or X-ray reflectometry (XRR).

An aluminum oxide film which can be used as a protective insulating film provided over the transistor 410 has a high shielding effect (blocking effect) of preventing penetration of both oxygen and impurities such as hydrogen and moisture.

Therefore, during and after the manufacturing process, the aluminum oxide film functions as a protective film for preventing entry of impurities such as hydrogen and moisture, which can cause a change, into the oxide semiconductor film 403 and release of oxygen, which is a main constituent material of the oxide semiconductor, from the oxide semiconductor film 403.

In addition, the planarization insulating film 408 may be formed in order to reduce surface roughness caused by the transistor 410. For the planarization insulating film 408, an organic material such as a polyimide-based resin, an acrylic-based resin, or a benzocyclobutene-based resin can be used. Other than such organic materials, it is also possible to use a low-dielectric constant material (low-k material) or the like. Note that the planarization insulating film 408 may be formed by stacking a plurality of insulating films formed of any of these materials.

For example, a 1500-nm-thick acrylic resin film may be formed as the planarization insulating film 408. The acrylic resin film can be formed in such a manner that an acrylic resin is applied by a coating method and then baked (e.g., at 250° C. in a nitrogen atmosphere for 1 hour).

Heat treatment may be performed after the planarization insulating film 408 is formed. For example, the heat treatment is performed at 250° C. in a nitrogen atmosphere for 1 hour.

As described above, heat treatment may be performed after formation of the transistor 410. Further, the heat treatment may be performed plural times.

Through the above process, the transistor 410 illustrated in FIGS. 1B and 1C is formed.

It is preferable that the condition of the impurity removal step be optimized in order to prevent the oxide semiconductor film 403 from being etched to be divided or removed in the impurity removal step. However, it is difficult to obtain a condition under which the oxide semiconductor film 403 is not removed at all. Therefore, in some cases, an exposed portion of the oxide semiconductor film 403 is partly removed, so that the oxide semiconductor film 403 may have a groove (depression). In this case, the transistor 420 which includes the oxide semiconductor film 403 having a groove (depression) can be formed as illustrated in FIG. 1D. Note that a cross-sectional view of the transistor 420 in the channel width W direction (cross-sectional view along line B1-B2 in FIG. 1A) is similar to FIG. 1C.

Note that the concentration of an impurity (typically a halogen element (e.g., chlorine or fluorine), a compound containing a halogen element, boron, or a compound containing boron) generated by the etching step can be estimated by a method such as secondary ion mass spectrometry (SIMS).

Figure 11:
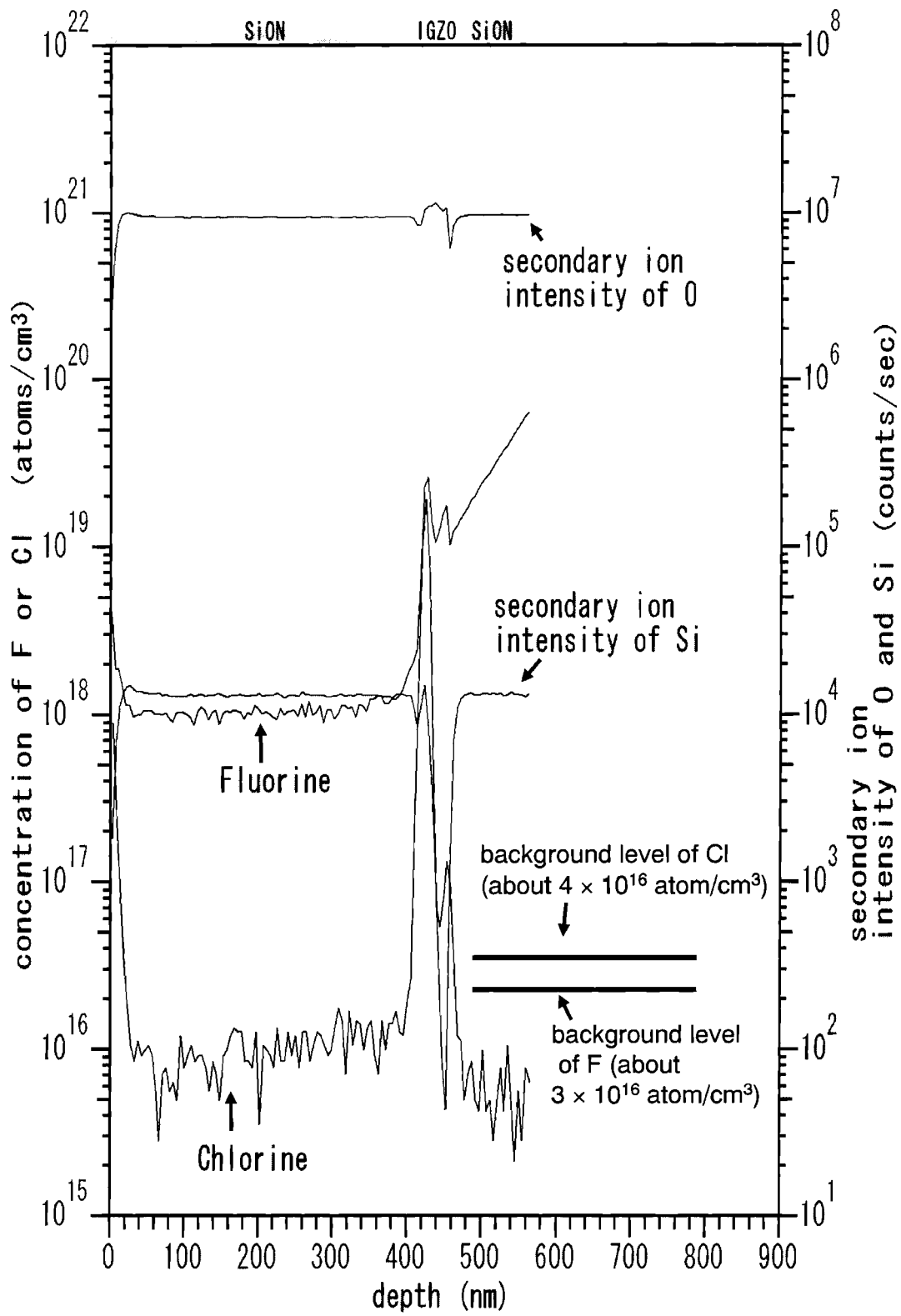
FIG. 11 is a graph showing results of SIMS measurement.

FIG. 11 shows results of secondary ion mass spectrometry (SIMS) measurement, where the chlorine concentration in an oxide semiconductor film of a transistor formed without performing an impurity removal step was measured. The sample transistor has a structure similar to that of the transistor 410 of this embodiment, and is formed using a material and a method similar to those of the transistor 410, except for not being subjected to solution treatment. Note that the insulating film 407 is formed over the transistor 410. The measurement area is a region where a silicon oxynitride film which is a protective insulating film (thickness: 400 nm), an IGZO film which is an oxide semiconductor film, and a silicon oxynitride film which is a gate insulating film are stacked in the thickness direction. The measurement was performed from the protective insulating film in the depth direction.

FIG. 11 shows that the chlorine concentration in the IGZO film that is the oxide semiconductor film is higher than $1\times10^{19}$ atoms/cm$^3$ and the oxide semiconductor film contains chlorine.

By performing the impurity removal step in the above manner, impurities (typically a halogen element (e.g., chlorine or fluorine), a compound containing a halogen element, boron, or a compound containing boron) generated by the etching step can be prevented from remaining on the surface of the oxide semiconductor film 403 and in the vicinity thereof. Further, on the surface of the oxide semiconductor film 403, the concentration of an impurity (e.g., chlorine) generated by the etching step can be lower than or equal to $5\times10^{18}$ atoms/cm$^3$ (preferably lower than or equal to $1\times10^{18}$ atoms/cm$^3$).

Accordingly, a highly reliable semiconductor device including the transistor 410 which is formed using the oxide semiconductor film 403 and has stable electric characteristics can be provided. Further, a highly reliable semiconductor device can be manufactured with a high yield, so that high productivity can be achieved.

Embodiment 2

In this embodiment, another embodiment of a semiconductor device and a method for manufacturing the semiconductor device are described with reference to FIGS. 3A to 3D and FIGS. 4A to 4E. Note that the description in the above embodiment can be applied to portions and steps which are the same as or have similar functions to those in the above embodiment; thus, repetitive description is omitted. In addition, detailed description of the same portions is omitted.

Figure 3A:
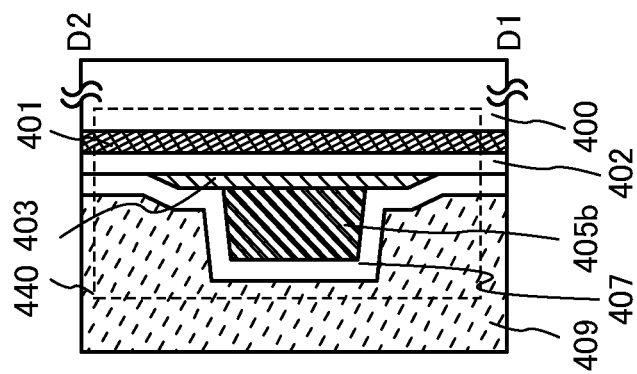
FIGS. 3A to 3D are a plan view and cross-sectional views which illustrate embodiments of a semiconductor device.
Figure 3B:
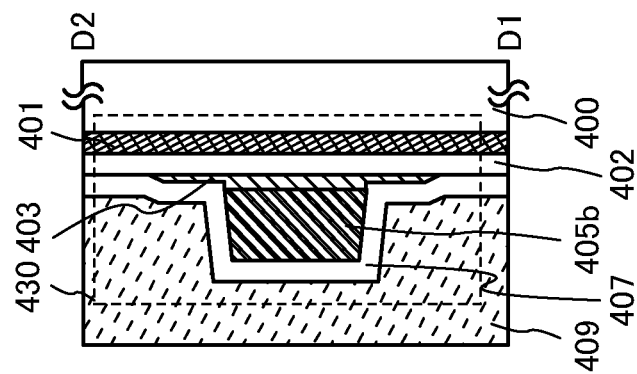
Figure 3C:
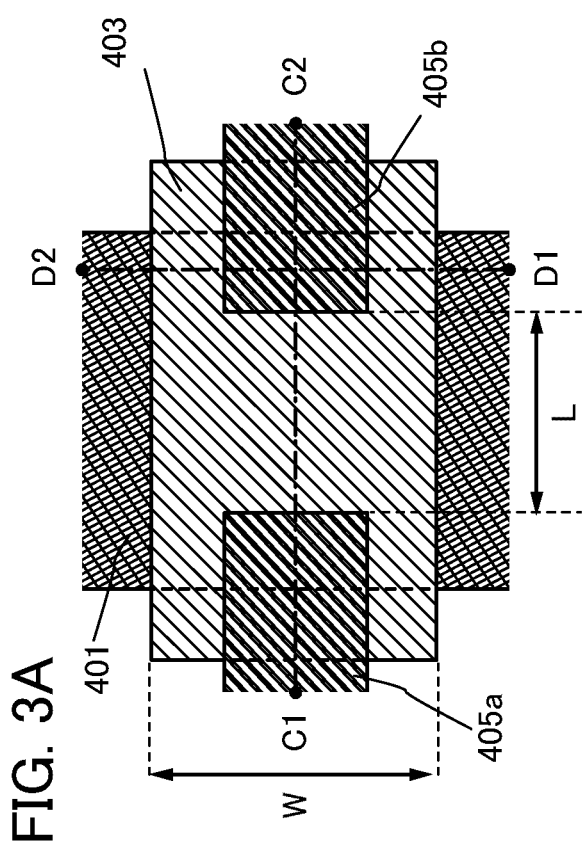

A transistor 430 illustrated in FIGS. 3A to 3C is an example of a transistor which is one of bottom-gate transistors and is also referred to as an inverted-staggered transistor. FIG. 3A is a plan view of the transistor 430, FIG. 3B is a cross-sectional view along line C1-C2 in FIG. 3A (cross-sectional view in the channel length direction), and FIG. 3C is a cross-sectional view along line D1-D2 in FIG. 3A (cross-sectional view in the channel width direction). In FIG. 3A, L represents the channel length and W represents the channel width. Note that, in FIG. 3A, some components of the transistor 430 (e.g., the gate insulating film 402) are not illustrated for brevity.

As illustrated in FIGS. 3A to 3C, a semiconductor device including the transistor 430 includes, over the substrate 400 having an insulating surface, the gate electrode layer 401, the gate insulating film 402, the oxide semiconductor film 403, the source electrode layer 405a, and the drain electrode layer 405b. Further, the insulating film 407 covering the transistor 430 is provided.

Also in the transistor 430 illustrated in FIGS. 3A to 3C, the halogen element concentration (e.g., chlorine concentration) at an interface between the oxide semiconductor film 403 and the insulating film 407 is reduced to be lower than or equal to $5\times10^{18}$ atoms/cm$^3$, preferably lower than or equal to $1\times10^{18}$ atoms/cm$^3$. Thus, a backchannel of the transistor 430 is prevented from having lower resistance (n-type conductivity), so that formation of a parasitic channel can be prevented in the transistor 430. Accordingly, the reliability of the transistor 430 can be improved.

Further, as illustrated in FIGS. 3A to 3C, each of the source electrode layer 405a and the drain electrode layer 405b of the transistor 430 has a width smaller than the channel width W of the oxide semiconductor film 403; therefore, end portions of the oxide semiconductor film 403 are exposed. For this reason, in some cases, part of the oxide semiconductor film 403 is removed in formation of the source electrode layer 405a and the drain electrode layer 405b. Moreover, in some cases, part of the oxide semiconductor film 403 is removed in an impurity removal step performed after the formation of the source electrode layer 405a and the drain electrode layer 405b. In these cases, owing to the removal of part of the oxide semiconductor film 403, in the oxide semiconductor film 403, the thickness of each of regions overlapping with the source electrode layer 405a and the drain electrode layer 405b is larger than that of a region overlapping with neither the source electrode layer 405a nor the drain electrode layer 405b as illustrated in FIGS. 3B and 3C.

Figure 3D:
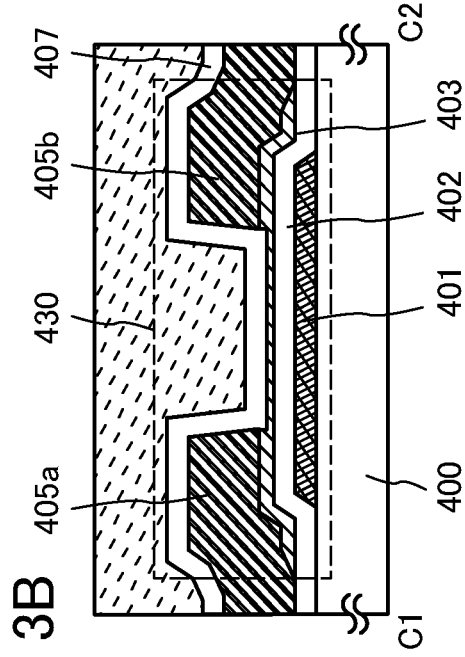

In the case where the oxide semiconductor film 403 is not removed, a transistor 440 illustrated in FIG. 3D is formed. Note that a cross-sectional view of the transistor 440 in the channel length L direction (cross-sectional view along line C1-C2 in FIG. 3A) is similar to that of the transistor 410, i.e., FIG. 1B.

Next, FIGS. 4A to 4E illustrate an example of a method for manufacturing the semiconductor device including the transistor 430.

First, a conductive film which is to be a gate electrode layer (including a wiring formed using the same layer as the gate electrode layer) is formed over the substrate 400. In this embodiment, a 100-nm-thick tungsten film is formed as the conductive film by a sputtering method.

Next, through a photolithography process, a resist mask is formed over the conductive film and selective etching is performed, so that the gate electrode layer 401 is formed. After the gate electrode layer 401 is formed, the resist mask is removed.

Next, the gate insulating film 402 is formed over the gate electrode layer 401. In this embodiment, a 200-nm-thick silicon oxynitride film is formed by a high-density plasma CVD method.

Figure 4A:
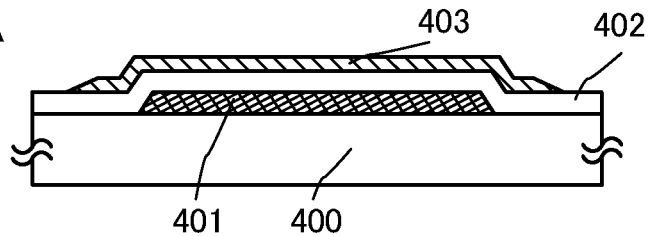
FIGS. 4A to 4E are cross-sectional views illustrating one embodiment of a method for manufacturing a semiconductor device.

Next, the oxide semiconductor film 403 is formed over the gate insulating film 402 (see FIG. 4A). In this embodiment, a 35-nm-thick In—Ga—Zn-based oxide film (IGZO film) is formed as the oxide semiconductor film 403 by a sputtering method using a sputtering apparatus including an AC power supply device. In this embodiment, an In—Ga—Zn-based oxide target having an atomic ratio of In:Ga:Zn=1:1:1 (=1/3:1/3:1/3) is used. Note that the film formation condition is as follows: the atmosphere is an atmosphere of oxygen and argon (oxygen flow rate: 50%), the pressure is 0.6 Pa, the power of the power source is 5 kW, and the substrate temperature is 170° C. The deposition rate under the film formation condition is 16 nm/min.

Heat treatment may be performed on the oxide semiconductor film 403 in order to remove excessive hydrogen (including water and a hydroxyl group) (to perform dehydration or dehydrogenation). In this embodiment, the substrate is introduced into an electric furnace, which is one of heat treatment apparatuses, and the oxide semiconductor film 403 is subjected to heat treatment at 450° C. in a nitrogen atmosphere for 1 hour and further at 450° C. in an atmosphere of nitrogen and oxygen for 1 hour.

Figure 4B:
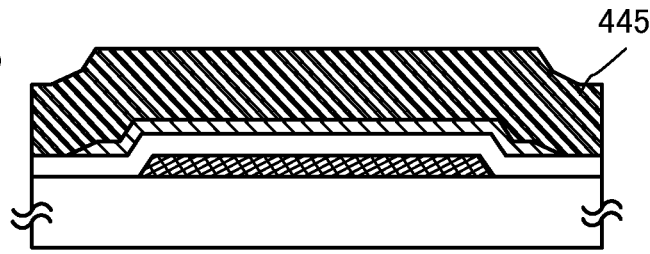

Next, the conductive film 445 which is to be a source electrode layer and a drain electrode layer (including a wiring formed using the same layer as the source electrode layer and the drain electrode layer) is formed over the gate electrode layer 401, the gate insulating film 402, and the oxide semiconductor film 403 (see FIG. 4B). In this embodiment, a 100-nm-thick titanium film, a 400-nm-thick aluminum film, and a 100-nm-thick titanium film are stacked by a sputtering method, and the stack of the titanium film, the aluminum film, and the titanium film is etched by a dry etching method; thus, the source electrode layer 405a and the drain electrode layer 405b are formed.

In this embodiment, since each of the source electrode layer 405a and the drain electrode layer 405b has a width smaller than the channel width W of the oxide semiconductor film 403, the end portions of the oxide semiconductor film 403 are exposed. Thus, it is preferable that the etching condition for the conductive film 445 be optimized in order to prevent the oxide semiconductor film 403 from being etched to be removed or divided in the etching step of the conductive film 445. However, it is difficult to obtain a condition under which only the conductive film 445 is etched and the oxide semiconductor film 403 is not etched at all. Therefore, in some cases, part of the oxide semiconductor film 403 is removed when the conductive film 445 is etched. In this case, owing to the removal of part of the oxide semiconductor film 403, in the oxide semiconductor film 403, the thickness of each of regions overlapping with the source electrode layer 405a and the drain electrode layer 405b is larger than that of a region overlapping with neither the source electrode layer 405a nor the drain electrode layer 405b.

In the case where an etching gas containing a halogen element is used in the etching step for forming the source electrode layer 405a and the drain electrode layer 405b, if the oxide semiconductor film 403 is exposed to the etching gas, the halogen element (e.g., chlorine or fluorine) contained in the etching gas extracts oxygen in the oxide semiconductor film 403 in some cases, which might cause an oxygen vacancy to be formed on a surface of the oxide semiconductor film 403. Such an oxygen vacancy in the oxide semiconductor film 403 might cause the backchannel of the oxide semiconductor film 403 to have lower resistance (n-type conductivity), resulting in formation of a parasitic channel.

Further, an element (e.g., boron) that is not halogen, which may be contained in the etching gas containing a halogen element, can cause the backchannel of the oxide semiconductor film 403 to have lower resistance.

In this embodiment, since the gas 447 containing a halogen element is used in the etching step for forming the source electrode layer 405a and the drain electrode layer 405b, an impurity to be generated is a halogen-based (in this embodiment, chlorine-based) impurity (a halogen element or a halogen compound). In addition, in the case where the gas 447 containing a halogen element contains boron as in this embodiment, boron or a compound containing boron may also be generated as an impurity.

Figure 4C:
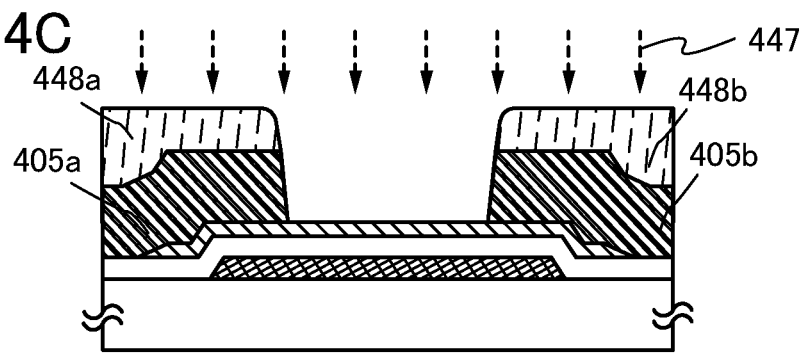
Figure 4D:
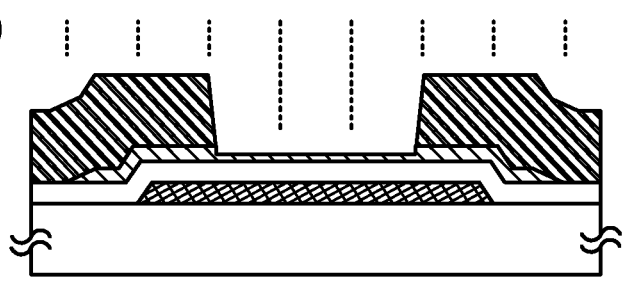

Thus, after the formation of the source electrode layer 405a and the drain electrode layer 405b, a step for removing impurities existing on the surface of the oxide semiconductor film 403 and in the vicinity thereof is performed (see FIG. 4D). For the impurity removal step, plasma treatment using oxygen, dinitrogen monoxide, or a rare gas (typically argon); solution treatment using dilute hydrofluoric acid, water, a developer, or a TMAH solution; or the like can be favorably employed. When an IGZO film is subjected treatment using dilute hydrofluoric acid, for example, $1/10^3$ dilute hydrofluoric acid (hydrofluoric acid: 0.05%), the thickness decreases by 1 nm to 3 nm per second. When the IGZO film is subjected to treatment using $2/10^5$ dilute hydrofluoric acid (hydrofluoric acid: 0.0025%), the thickness decreases by approximately 0.1 nm per second. By performing the impurity removal treatment on the oxide semiconductor film 403, the halogen element concentration (e.g., chlorine concentration) on the surface of the oxide semiconductor film 403 can be reduced to be lower than or equal to $5 \times 10^{18}$ atoms/cm$^3$, preferably lower than or equal to $1 \times 10^{18}$ atoms/cm$^3$. In this embodiment, an example in which solution treatment using $1/10^3$ dilute hydrofluoric acid is performed as the impurity removal step is described.

It is preferable that the condition of the impurity removal step be optimized in order to prevent the oxide semiconductor film 403 from being etched to be divided or removed in the impurity removal step. However, it is difficult to obtain a condition under which the oxide semiconductor film 403 is not removed at all. Therefore, in some cases, an exposed portion of the oxide semiconductor film 403 is partly removed, so that the oxide semiconductor film 403 may have a groove (depression). FIG. 4D illustrates the case where part of the oxide semiconductor film 403 is removed through the impurity removal step, so that the oxide semiconductor film 403 has a groove (depression). As illustrated in FIG. 4D, in the oxide semiconductor film 403, the thickness of each of regions overlapping with the source electrode layer 405a and the drain electrode layer 405b is larger than that of a region overlapping with neither the source electrode layer 405a nor the drain electrode layer 405b. For a cross-sectional view in the channel width W direction, refer to the cross-sectional view of FIG. 3C.

Figure 4E:
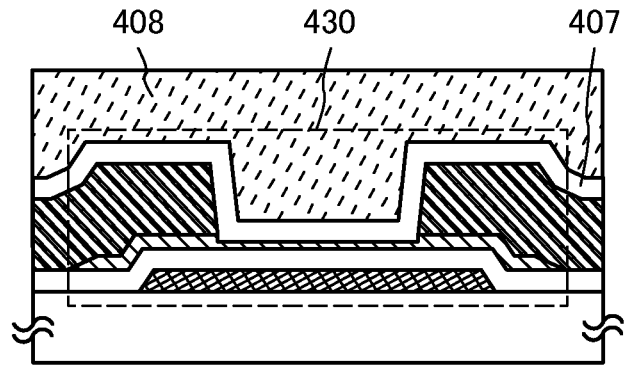

Through the above process, the transistor 430 of this embodiment is formed (see FIG. 4E).

In this embodiment, the insulating film 407 serving as a protective insulating film is formed over the source electrode layer 405a and the drain electrode layer 405b so as to be in contact with the oxide semiconductor film 403. For example, a 400-nm-thick silicon oxynitride film is formed by a CVD method. Further, heat treatment may be performed after the protective insulating film is formed. For example, the heat treatment is performed at 300° C. in a nitrogen atmosphere for 1 hour.

In addition, the planarization insulating film 408 may be formed in order to reduce surface roughness caused by the transistor 430.

For example, a 1500-nm-thick acrylic resin film may be formed as the planarization insulating film 408 over the protective insulating film. The acrylic resin film can be formed in such a manner that an acrylic resin is applied by a coating method and then baked (e.g., at 250° C. in a nitrogen atmosphere for 1 hour).

Heat treatment may be performed after the planarization insulating film is formed. For example, the heat treatment is performed at 250° C. in a nitrogen atmosphere for 1 hour.

By performing the impurity removal step in the above manner, impurities can be prevented from remaining on the surface of the oxide semiconductor film 403 and in the vicinity thereof. Therefore, on the surface of the oxide semiconductor film 403 of the transistor 430, the concentration of an impurity (typically a halogen element (e.g., chlorine or fluorine), boron, or a compound containing boron) generated by the etching step is reduced. Further, at the interface between the oxide semiconductor film 403 and the insulating film 407, the concentration of an impurity (typically a halogen element (e.g., chlorine or fluorine), boron, phosphorus, aluminum, iron, or carbon) generated by the etching step can be lower than or equal to $5\times10^{18}$ atoms/cm$^3$ (preferably lower than or equal to $1\times10^{18}$ atoms/cm$^3$).

Accordingly, a highly reliable semiconductor device including the transistor 430 which is formed using the oxide semiconductor film 403 and has stable electric characteristics can be provided. Further, a highly reliable semiconductor device is manufactured with a high yield, so that high productivity can be achieved.

Embodiment 3

A semiconductor device having a display function (also referred to as a display device) can be manufactured using the transistor described in Embodiment 1 or 2. Further, part or whole of a driver circuit including the transistor can be formed over a substrate where a pixel portion is formed, whereby a system-on-panel can be obtained.

Figure 5A:
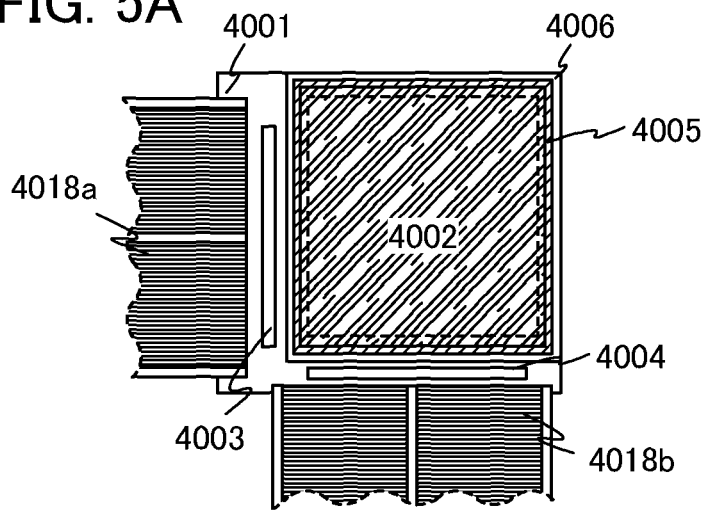
FIGS. 5A to 5C are plan views each illustrating one embodiment of a semiconductor device.

In FIG. 5A, a sealant 4005 is provided so as to surround a pixel portion 4002 provided over a first substrate 4001, and the pixel portion 4002 is sealed using a second substrate 4006. In FIG. 5A, a signal line driver circuit 4003 and a scan line driver circuit 4004 which are each formed using a single crystal semiconductor film or a polycrystalline semiconductor film over a substrate separately prepared are mounted in a region that is different from the region surrounded by the sealant 4005 over the first substrate 4001. Further, a variety of signals and potentials are supplied to the signal line driver circuit 4003 and the scan line driver circuit 4004, which are separately formed, and the pixel portion 4002 from flexible printed circuits (FPCs) 4018a and 4018b.

Figure 5B:
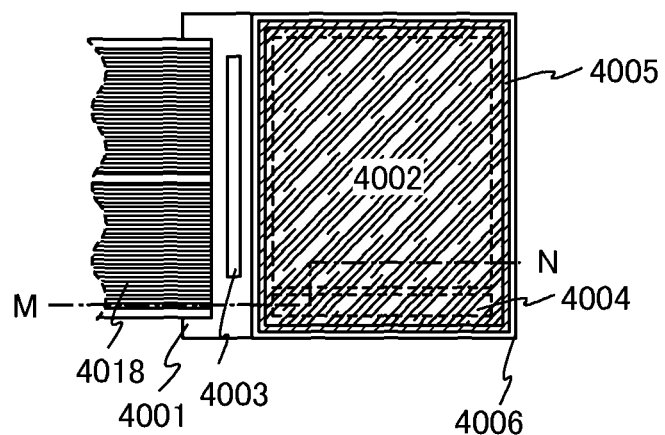
Figure 5C:
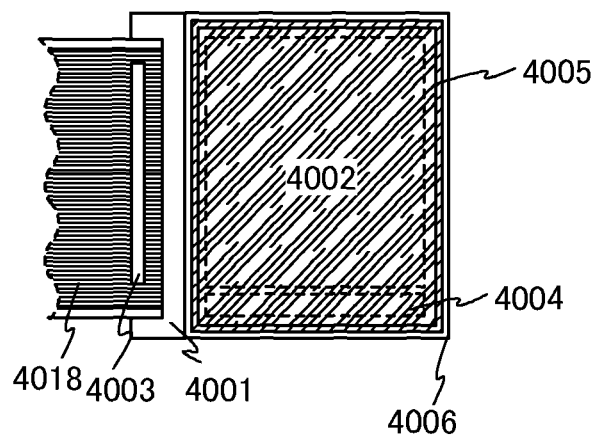

In FIGS. 5B and 5C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 5B and 5C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 5B and 5C, a variety of signals and potentials are supplied to the signal line driver circuit 4003, which is separately formed, the scan line driver circuit 4004, and the pixel portion 4002 from an FPC 4018.

Although FIGS. 5B and 5C each illustrate an example in which the signal line driver circuit 4003 is formed separately and then mounted on the first substrate 4001, one embodiment of the present invention is not limited to this structure. The scan line driver circuit may be formed separately and then mounted, or only part of the signal line driver circuit or part of the scan line driver circuit may be formed separately and then mounted.

Note that there is no particular limitation on the method for connecting a separately formed driver circuit, and a chip on glass (COG) method, a wire bonding method, a tape automated bonding (TAB) method, or the like can be used. FIG. 5A illustrates an example in which the signal line driver circuit 4003 and the scan line driver circuit 4004 are mounted by a COG method. FIG. 5B illustrates an example in which the signal line driver circuit 4003 is mounted by a COG method. FIG. 5C illustrates an example in which the signal line driver circuit 4003 is mounted by a TAB method.

In addition, the display device includes a panel in which a display element is sealed, and a module in which an IC or the like including a controller is mounted on the panel.

Note that a display device in this specification means an image display device, a display unit, or a light source (including a lighting device). Further, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit which are provided over the first substrate include a plurality of transistors, and the transistor described in Embodiment 1 or 2 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by current or voltage and specifically includes an inorganic electroluminescent (EL) element, an organic EL element, and the like. Furthermore, a display medium whose contrast is changed by an electric effect, such as electronic ink, can be used.

Embodiments of the semiconductor device are described with reference to FIGS. 5A to 5C, FIGS. 6A and 6B, and FIGS. 7A and 7B. FIGS. 7A and 7B are cross-sectional views along dashed-dotted line M-N in FIG. 5B.

As illustrated in FIGS. 5A to 5C and FIGS. 7A and 7B, the semiconductor device includes a connection terminal electrode 4015 and a terminal electrode 4016. The connection terminal electrode 4015 and the terminal electrode 4016 are electrically connected to a terminal included in the FPC 4018 or 4018b through an anisotropic conductive film 4019.

The connection terminal electrode 4015 is formed using the same conductive film as a first electrode layer 4030, and the terminal electrode 4016 is formed using the same conductive film as gate electrode layers of transistors 4010 and 4011.

The pixel portion 4002 and the scan line driver circuit 4004 which are provided over the first substrate 4001 include a plurality of transistors. FIGS. 7A and 7B illustrate the transistor 4010 included in the pixel portion 4002 and the transistor 4011 included in the scan line driver circuit 4004, as an example. In FIG. 7A, an insulating film 4020 is provided over the transistors 4010 and 4011. In FIG. 7B, an insulating film 4021 is further provided.

The transistor described in Embodiment 1 or 2 can be applied to the transistors 4010 and 4011. In this embodiment, as an example, a transistor which has a structure similar to that of the transistor 410 described in Embodiment 1 and is obtained by a manufacturing method similar to that of the transistor 410 is used.

Each of the transistors 4010 and 4011 has a structure similar to that of the transistor 410 described in Embodiment 1, and is obtained by a manufacturing method similar to that of the transistor 410. In the manufacturing method, a source electrode layer and a drain electrode layer are formed through an etching step using an etching gas containing a halogen element, and then a step in which impurities contained in the etching gas are removed from a surface of an oxide semiconductor film and the vicinity thereof is performed. For the impurity removal step, for example, dilute hydrofluoric acid treatment or plasma treatment using oxygen or dinitrogen monoxide can be favorably employed.

Since the surface of the oxide semiconductor film and the vicinity thereof can be prevented from being contaminated by impurities contained in the etching gas, on the surface of the oxide semiconductor film of each of the transistors 4010 and 4011, the halogen element concentration can be lower than or equal to $5 \times 10^{18}$ atoms/cm$^3$ (preferably lower than or equal to $1 \times 10^{18}$ atoms/cm$^3$).

Accordingly, highly reliable semiconductor devices can be provided as the semiconductor devices of this embodiment in FIGS. 5A to 5C and FIGS. 7A and 7B, which includes the transistors 4010 and 4011 which are formed using an oxide semiconductor film and have stable electric characteristics. Further, such a highly reliable semiconductor device can be manufactured with a high yield, so that high productivity can be achieved.

In addition, a conductive layer may be provided so as to overlap with a channel formation region of the oxide semiconductor film in the transistor 4011 for the driver circuit. The conductive layer is provided so as to overlap with the channel formation region of the oxide semiconductor film, whereby the amount of change in the threshold voltage of the transistor 4011 by a bias-temperature stress test (BT test) can be further reduced. The conductive layer may have the same potential as or a potential different from that of a gate electrode layer of the transistor 4011, and can function as a second gate electrode layer. The potential of the conductive layer may be GND or 0 V, or the conductive layer may be in a floating state.

The conductive layer also has a function of blocking an external electric field, that is, preventing an external electric field (particularly, preventing static electricity) from affecting the inside (a circuit portion including a transistor). The blocking function of the conductive layer can prevent change in electric characteristics of the transistor due to an influence of an external electric field such as static electricity.

The transistor 4010 provided in the pixel portion 4002 is electrically connected to a display element to form a display panel. There is no particular limitation on the kind of the display element as long as display can be performed, and various kinds of display elements can be employed.

An example of a liquid crystal display device using a liquid crystal element as a display element is illustrated in FIG. 7A. In FIG. 7A, a liquid crystal element 4013 which is a display element includes the first electrode layer 4030, a second electrode layer 4031, and a liquid crystal layer 4008. Insulating films 4032 and 4033 functioning as alignment films are provided so that the liquid crystal layer 4008 is interposed therebetween. The second electrode layer 4031 is provided on the second substrate 4006 side, and the first electrode layer 4030 and the second electrode layer 4031 are stacked with the liquid crystal layer 4008 interposed therebetween.

A spacer 4035 is a columnar spacer which is obtained by selective etching of an insulating film and is provided in order to control the thickness of the liquid crystal layer 4008 (cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase, for which an alignment film is unnecessary, may be used for the liquid crystal layer 4008. In this case, the liquid crystal layer 4008 is in contact with the first electrode layer 4030 and the second electrode layer 4031. A blue phase is one of liquid crystal phases, which is generated just before a cholesteric phase changes into an isotropic phase while the temperature of a cholesteric liquid crystal is increased. The blue phase can be exhibited using a liquid crystal composition which is a mixture of a liquid crystal and a chiral agent. In order to increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which makes the alignment process unnecessary and the viewing angle dependence small. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, the productivity of the liquid crystal display device can be improved. A transistor formed using an oxide semiconductor film has a possibility that the electric characteristics may change significantly by the influence of static electricity and deviate from the designed range. Therefore, it is more effective to use a liquid crystal composition exhibiting a blue phase for the liquid crystal display device including the transistor formed using an oxide semiconductor film.

The specific resistivity of the liquid crystal material is higher than or equal to $1 \times 10^9 \Omega \cdot$cm, preferably higher than or equal to $1 \times 10^{11} \Omega \cdot$cm, further preferably higher than or equal to $1 \times 10^{12} \Omega \cdot$cm. Note that the specific resistivity in this specification is measured at 20° C.

The size of a storage capacitor formed in the liquid crystal display device is set considering the leakage current of the transistor provided in the pixel portion, or the like so that charge can be held for a predetermined period. The size of the storage capacitor may be set considering the off-state current of the transistor, or the like. By using the transistor including an oxide semiconductor film disclosed in this specification, it is enough to provide a storage capacitor having a capacitance that is ⅓ or less, preferably ⅕ or less, of liquid crystal capacitance of each pixel.

In the transistor formed using an oxide semiconductor film disclosed in this specification, the current in an off state (off-state current) can be controlled to be low. Accordingly, an electrical signal such as an image signal can be held for a longer time, and a writing interval can be set longer in an on state. Accordingly, the frequency of refresh operation can be reduced, which leads to an effect of suppressing power consumption.

The transistor formed using an oxide semiconductor film disclosed in this specification can have relatively high field-effect mobility and thus can operate at high speed. For example, when such a transistor which can operate at high speed is used for a liquid crystal display device, a switching transistor in a pixel portion and a driver transistor in a driver circuit portion can be formed over one substrate. That is, since a semiconductor device formed using a silicon wafer or the like is not additionally needed as a driver circuit, the number of components of the semiconductor device can be reduced. In addition, by using the transistor which can operate at high speed in the pixel portion, a high-quality image can be provided.

For the liquid crystal display device, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an Advanced Super View (ASV) mode can be used. Furthermore, this embodiment can be applied to a VA liquid crystal display device. The VA liquid crystal display device has a kind of form in which the alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white) or R, G, B, and one or more of yellow, cyan, magenta, and the like can be used. Further, the sizes of display regions may be different between respective dots of color elements. Note that one embodiment of the invention disclosed herein is not limited to the application to a display device for color display; one embodiment of the invention disclosed herein can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element. In this embodiment, an example in which an organic EL element is used as the light-emitting element is described.

Inorganic EL elements are classified according to their element structures into a dispersion-type inorganic EL element and a thin-film inorganic EL element. A dispersion-type inorganic EL element has a light-emitting layer in which particles of a light-emitting material are dispersed in a binder, and its light emission mechanism is donor-acceptor recombination type light emission that utilizes a donor level and an acceptor level. A thin-film inorganic EL element has a structure where a light-emitting layer is interposed between dielectric layers, which are further interposed between electrodes, and its light emission mechanism is localized type light emission that utilizes inner-shell electron transition of metal ions. Note that description is made here using an organic EL element as the light-emitting element.

In order to extract light emitted from the light-emitting element, at least one of a pair of electrodes has a light-transmitting property. A transistor and the light-emitting element are formed over a substrate. The light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side, and a light-emitting element having any of these emission structures can be used.

Figure 6A:
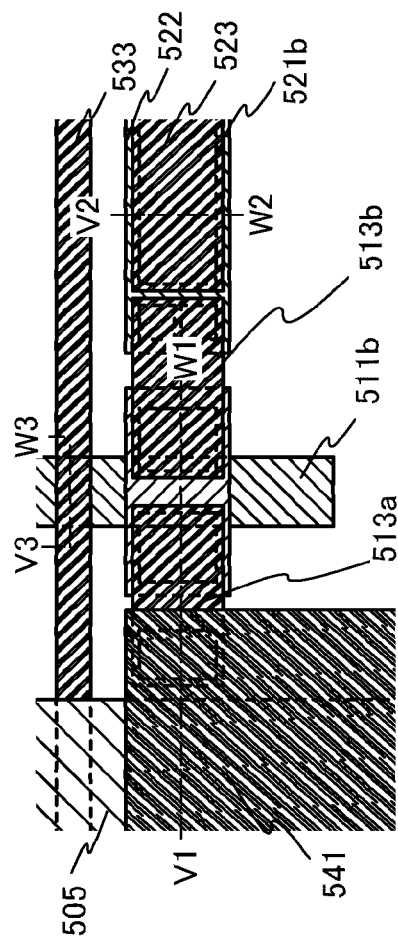
FIGS. 6A and 6B are a plan view and a cross-sectional view which illustrate one embodiment of a semiconductor device.
Figure 6B:
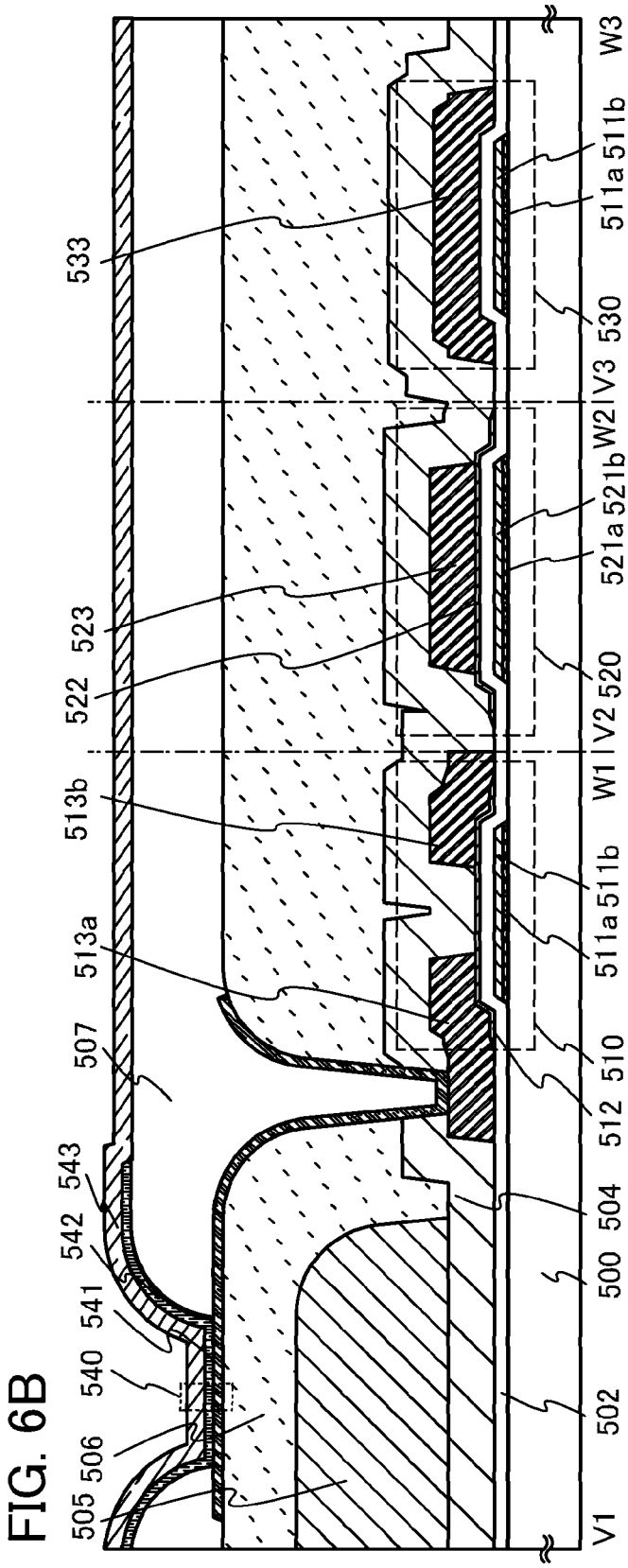

FIGS. 6A and 6B and FIG. 7B illustrate examples of a light-emitting device using a light-emitting element as a display element.

FIG. 6A is a plan view of a light-emitting device, and FIG. 6B is a cross-sectional view taken along dashed-dotted lines V1-W1, V2-W2, and V3-W3 in FIG. 6A. Note that an electroluminescent layer 542 and a second electrode layer 543 are not illustrated in the plan view of FIG. 6A.

The light-emitting device illustrated in FIGS. 6A and 6B includes, over a substrate 500, a transistor 510, a capacitor 520, and a wiring layer intersection 530. The transistor 510 is electrically connected to a light-emitting element 540. Note that FIGS. 6A and 6B illustrate a bottom-emission light-emitting device in which light from the light-emitting element 540 is extracted through the substrate 500.

The transistor described in Embodiment 1 or 2 can be applied to the transistor 510. In this embodiment, as an example, a transistor which has a structure similar to that of the transistor 410 described in Embodiment 1 and is obtained by a manufacturing method similar to that of the transistor 410 is used.

The transistor 510 includes gate electrode layers 511a and 511b, a gate insulating film 502, an oxide semiconductor film 512, and conductive layers 513a and 513b functioning as a source electrode layer and a drain electrode layer.

The transistor 510 has a structure similar to that of the transistor 410 described in Embodiment 1, and is obtained by a manufacturing method similar to that of the transistor 410. In the manufacturing method, the conductive layers 513a and 513b functioning as the source electrode layer and the drain electrode layer are formed through an etching step using an etching gas containing a halogen element, and then a step in which impurities contained in the etching gas are removed from a surface of the oxide semiconductor film and the vicinity thereof is performed. For the impurity removal step, for example, dilute hydrofluoric acid treatment or plasma treatment using oxygen or dinitrogen monoxide can be favorably employed.

Since the surface of the oxide semiconductor film and the vicinity thereof can be prevented from being contaminated by impurities contained in the etching gas, on the surface of the oxide semiconductor film of the transistor 510, the halogen element concentration can be lower than or equal to $5 \times 10^{18}$ atoms/cm$^3$ (preferably lower than or equal to $1 \times 10^{18}$ atoms/cm$^3$).

Accordingly, a highly reliable semiconductor device can be provided as the semiconductor device of this embodiment in FIGS. 6A and 6B, which includes the transistor 510 which is formed using the oxide semiconductor film 512 and has stable electric characteristics. Further, such a highly reliable semiconductor device can be manufactured with a high yield, so that high productivity can be achieved.

The capacitor 520 includes conductive layers 521a and 521b, the gate insulating film 502, an oxide semiconductor film 522, and a conductive layer 523. The gate insulating film 502 and the oxide semiconductor film 522 are interposed between the conductive layer 523 and the conductive layers 521a and 521b, so that the capacitor is formed.

The wiring layer intersection 530 is an intersection of a conductive layer 533 and the gate electrode layers 511a and 511b. The conductive layer 533 and the gate electrode layers 511a and 511b intersect with each other with the gate insulating film 502 provided therebetween.

In this embodiment, a 30-nm-thick titanium film is used as the gate electrode layer 511a and the conductive layer 521a, and a 200-nm-thick copper thin film is used as the gate electrode layer 511b and the conductive layer 521b. Thus, the gate electrode layer has a stacked structure of a titanium film and a copper thin film.

A 25-nm-thick IGZO film is used as the oxide semiconductor films 512 and 522.

An interlayer insulating film 504 is formed over the transistor 510, the capacitor 520, and the wiring layer intersection 530. Over the interlayer insulating film 504, a color filter layer 505 is provided in a region overlapping with the light-emitting element 540. An insulating film 506 functioning as a planarization insulating film is provided over the interlayer insulating film 504 and the color filter layer 505.

The light-emitting element 540 having a stacked structure in which a first electrode layer 541, the electroluminescent layer 542, and the second electrode layer 543 are stacked in this order is provided over the insulating film 506. The first electrode layer 541 and the conductive layer 513a are in contact with each other in an opening which is formed in the insulating film 506 and the interlayer insulating film 504 to reach the conductive layer 513a; thus, the light-emitting element 540 and the transistor 510 are electrically connected to each other. Note that a partition 507 is provided so as to cover part of the first electrode layer 541 and the opening.

As the interlayer insulating film 504, a silicon oxynitride film having a thickness greater than or equal to 200 nm and less than or equal to 600 nm, which is formed by a plasma CVD method, can be used. Further, a photosensitive acrylic film having a thickness of 1500 nm and a photosensitive polyimide film having a thickness of 1500 nm can be used as the insulating film 506 and the partition 507, respectively.

As the color filter layer 505, for example, a chromatic light-transmitting resin can be used. As the chromatic light-transmitting resin, a photosensitive organic resin or a non-photosensitive organic resin can be used. A photosensitive organic resin layer is preferably used, because the number of resist masks can be reduced, leading to simplification of a process.

Chromatic colors are all colors except achromatic colors such as black, gray, and white. The color filter layer is formed of a material which transmits only light of a chromatic color. As the chromatic color, red, green, blue, or the like can be used. Further, cyan, magenta, yellow, or the like may be used. "Transmitting only light of a chromatic color" means that light passing through the color filter layer has a peak at a wavelength of the light of the chromatic color. The thickness of the color filter layer may be controlled as appropriate in consideration of the relation between the concentration of a coloring material to be contained and the light transmittance. For example, the color filter layer 505 may have a thickness greater than or equal to 1500 nm and less than or equal to 2000 nm.

In the light-emitting device illustrated in FIG. 7B, a light-emitting element 4513 which is a display element is electrically connected to the transistor 4010 provided in the pixel portion 4002. A structure of the light-emitting element 4513 is not limited to the stacked structure including the first electrode layer 4030, an electroluminescent layer 4511, and the second electrode layer 4031, which is illustrated in FIG. 7B. The structure of the light-emitting element 4513 can be changed as appropriate in accordance with the direction in which light is extracted from the light-emitting element 4513, or the like.

Partitions 4510 and 507 are formed using an organic insulating material or an inorganic insulating material. It is particularly preferable that the partitions 4510 and 507 be formed using a photosensitive resin material to have openings over the first electrode layers 4030 and 541, respectively. A sidewall of each opening is preferably formed as a tilted surface with continuous curvature.

The electroluminescent layers 4511 and 542 may each be a single layer or a stack of plural layers.

A protective film may be formed over the second electrode layer 4031 and the partition 4510 and over the second electrode layer 543 and the partition 507 in order to prevent entry of oxygen, hydrogen, moisture, carbon dioxide, and the like into the light-emitting elements 4513 and 540. As the protective film, a silicon nitride film, a silicon nitride oxide film, a DLC film, or the like can be formed.

Further, the light-emitting elements 4513 and 540 may be covered with respective layers containing an organic compound deposited by an evaporation method so that oxygen, hydrogen, moisture, carbon dioxide, and the like do not enter the light-emitting elements 4513 and 540.

In addition, in a space which is formed with the first substrate 4001, the second substrate 4006, and the sealant 4005, a filler 4514 is provided for sealing. It is preferable that the light-emitting element be packaged (sealed) with a protective film (such as a laminate film or an ultraviolet curable resin film) or a cover material with high air-tightness and little degasification so that the light-emitting element is not exposed to the outside air, in this manner.

As the filler 4514, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen may be used as the filler.

In addition, as needed, an optical film such as a polarizing plate, a circularly polarizing plate (including an elliptically polarizing plate), a retardation plate (quarter-wave plate or half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, electronic paper in which electronic ink is driven can be provided as the display device. The electronic paper is also referred to as an electrophoretic display device (electrophoretic display) and is advantageous in that it has the same level of readability as plain paper, it has lower power consumption than other display devices, and it can be made thin and lightweight.

An electrophoretic display device can have various modes. An electrophoretic display device includes a plurality of microcapsules dispersed in a solvent or a solute, and each microcapsule contains first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain a pigment and do not move without an electric field. Moreover, the first particles and the second particles have different colors (which may be colorless).

Thus, an electrophoretic display device is a display device that utilizes a dielectrophoretic effect by which a substance having a high dielectric constant moves to a high-electric field region.

Liquid in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these materials.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

Note that, in FIGS. 5A to 5C, FIGS. 6A and 6B, and FIGS. 7A and 7B, a flexible substrate as well as a glass substrate can be used as any of the first substrates 4001, the substrate 500 and the second substrate 4006. For example, a plastic substrate having a light-transmitting property can be used. As the plastic substrate, a fiberglass-reinforced plastics (FRP) plate, a polyvinyl fluoride (PVF) film, a polyester film, or an acrylic resin film can be used. In the case where a light-transmitting property is not needed, a metal substrate (metal film) of aluminum, stainless steel, or the like may be used. For example, a sheet with a structure in which an aluminum foil is interposed between PVF films or polyester films can be used.

In this embodiment, an aluminum oxide film is used as the insulating film 4020. The insulating film 4020 can be formed by a sputtering method or a plasma CVD method.

The aluminum oxide film provided as the insulating film 4020 over the oxide semiconductor film has a high shielding effect (blocking effect) of preventing penetration of both oxygen and impurities such as hydrogen and moisture.

Therefore, during and after the manufacturing process, the aluminum oxide film functions as a protective film for preventing entry of impurities such as hydrogen and moisture, which can cause a change, into the oxide semiconductor film and release of oxygen, which is a main constituent material of the oxide semiconductor, from the oxide semiconductor film.

The insulating films 4021 and 506 functioning as planarization insulating films can be formed using an organic material having heat resistance, such as an acrylic-based resin, a polyimide-based resin, a benzocyclobutene-based resin, a polyamide-based resin, or an epoxy-based resin. Other than such organic materials, it is also possible to use a low-dielectric constant material (low-k material), a siloxane-based resin, phosphosilicate glass (PSG), borophosphosilicate glass (BPSG), or the like. The insulating film may be formed by stacking a plurality of insulating films formed of any of these materials.

There is no particular limitation on the method for forming the insulating films 4021 and 506 and the following method or tool (equipment) can be used depending on the material: a sputtering method, an SOG method, spin coating, dipping, spray coating, a droplet discharge method (such as an inkjet method), a printing method (such as screen printing or offset printing), a doctor knife, a roll coater, a curtain coater, a knife coater, or the like.

The display device displays an image by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode layer and the second electrode layer (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, and the pattern structure of the electrode layer.

The first electrode layers 4030 and 541 and the second electrode layers 4031 and 543 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or graphene.

Alternatively, the first electrode layers 4030 and 541 and the second electrode layers 4031 and 543 can be formed using one or more materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

In this embodiment, since the light-emitting device illustrated in FIGS. 6A and 6B has a bottom-emission structure, the first electrode layer 541 has a light-transmitting property and the second electrode layer 543 has a light-reflecting property. Accordingly, in the case of using a metal film as the first electrode layer 541, the film is preferably thin enough to secure a light-transmitting property; in the case of using a light-transmitting conductive film as the second electrode layer 543, a conductive film having a light-reflecting property is preferably stacked therewith.

A conductive composition containing a conductive high molecule (also referred to as a conductive polymer) can be used for the first electrode layers 4030 and 541 and the second electrode layers 4031 and 543. As the conductive high molecule, a π-electron conjugated conductive polymer can be used. For example, polyaniline or a derivative thereof, polypyrrole or a derivative thereof, polythiophene or a derivative thereof, and a copolymer of two or more kinds of aniline, pyrrole, and thiophene or a derivative thereof can be given.

Since the transistor is easily damaged owing to static electricity or the like, a protective circuit for protecting the driver circuit is preferably provided. The protective circuit is preferably formed using a nonlinear element.

As described above, by using the transistor described in Embodiment 1 or 2, a semiconductor device having a variety of functions can be provided.

The structures, methods, and the like described in this embodiment can be combined as appropriate with any of structures, methods, and the like described in the other embodiments.

Embodiment 4

A semiconductor device having an image sensor function of reading data on an object can be manufactured using the transistor described in Embodiment 1 or 2.

Figure 8A:
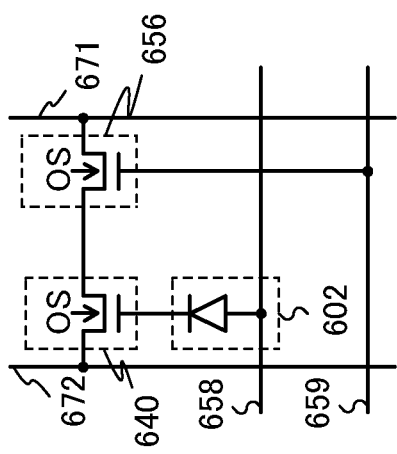
FIGS. 8A and 8B are a circuit diagram and a cross-sectional view which illustrate one embodiment of a semiconductor device.

FIG. 8A illustrates an example of a semiconductor device having an image sensor function. FIG. 8A is an equivalent circuit diagram of a photo sensor, and FIG. 8B is a cross-sectional view illustrating part of the photo sensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photo sensor reference signal line 672, and the other of the source and the drain of the transistor 640 is electrically connected to one of a source and a drain of a transistor 656. A gate of the transistor 656 is electrically connected to a gate signal line 659, and the other of the source and the drain of the transistor 656 is electrically connected to a photo sensor output signal line 671.

Note that, in the circuit diagram in this specification, a transistor formed using an oxide semiconductor film is denoted by a symbol "OS" so that it can be identified as a transistor formed using an oxide semiconductor film. In FIG. 8A, the transistor 640 and the transistor 656 are each a transistor formed using an oxide semiconductor film, to which the transistor described in Embodiment 1 or 2 can be applied. In this embodiment, as an example, a transistor which has a structure similar to that of the transistor 410 described in Embodiment 1 and is obtained by a manufacturing method similar to that of the transistor 410 is used.

Figure 8B:
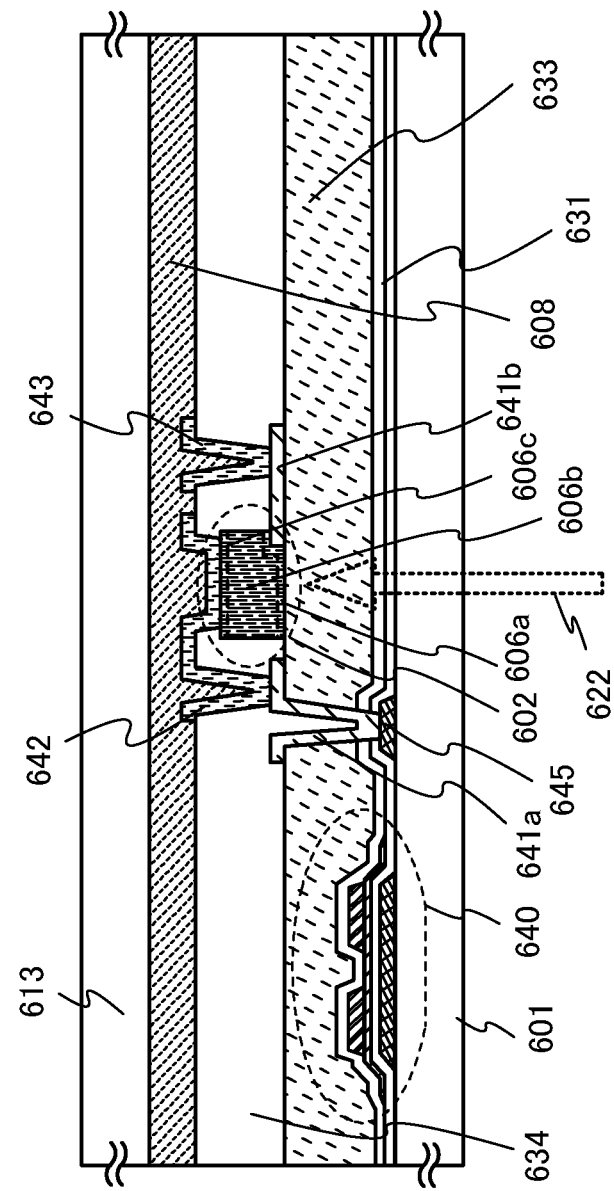

FIG. 8B is a cross-sectional view of the photodiode 602 and the transistor 640 in the photo sensor. The photodiode 602 functioning as a sensor and the transistor 640 are provided over a substrate 601 (TFT substrate) having an insulating surface. A substrate 613 is provided over the photodiode 602 and the transistor 640 with the use of an adhesive layer 608.

An insulating film 631, an interlayer insulating film 633, and an interlayer insulating film 634 are provided over the transistor 640. The photodiode 602 is provided over the interlayer insulating film 633. In the photodiode 602, a first semiconductor film 606a, a second semiconductor film 606b, and a third semiconductor film 606c are sequentially stacked from the interlayer insulating film 633 side, between electrode layers 641a and 641b formed over the interlayer insulating film 633 and an electrode layer 642 formed over the interlayer insulating film 634.

The electrode layer 641b is electrically connected to a conductive layer 643 formed over the interlayer insulating film 634, and the electrode layer 642 is electrically connected to a conductive layer 645 through the electrode layer 641a. The conductive layer 645 is electrically connected to a gate electrode layer of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma CVD method with the use of a semiconductor source gas containing an impurity element belonging to Group 13 (e.g., boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method for forming the amorphous silicon film, an LPCVD method, a vapor deposition method, a sputtering method, or the like may be used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma CVD method with the use of a semiconductor source gas containing an impurity element belonging to Group 15 (e.g., phosphorus (P)). As the semiconductor source gas, silane (SiH$_4$) may be used. Alternatively, Si$_2$H$_6$, SiH$_2$Cl$_2$, SiHCl$_3$, SiCl$_4$, SiF$_4$, or the like may be used. Alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method for forming the amorphous silicon film, an LPCVD method, a vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

In addition, the mobility of holes generated by a photoelectric effect is lower than the mobility of electrons. Therefore, a pin photodiode has better characteristics when a surface on the p-type semiconductor film side is used as a light-receiving plane. Here, an example in which light received by the photodiode 602 from a surface of the substrate 601, over which the pin photodiode is formed, is converted into electrical signals is described. Further, light from the semiconductor film having a conductivity type opposite to that of the semiconductor film on the light-receiving plane is disturbance light; therefore, the electrode layer is preferably formed using a light-blocking conductive film. Note that the n-type semiconductor film side may alternatively be a light-receiving plane.

With the use of an insulating material, the insulating film 631, the interlayer insulating film 633, and the interlayer insulating film 634 can be formed, depending on the material, by a sputtering method, a plasma CVD method, an SOG method, spin coating, dipping, spray coating, a droplet discharge method (such as an inkjet method), a printing method (such as screen printing or offset printing), or the like.

The insulating film 631 can be formed using an inorganic insulating material and can have a single-layer structure or a stacked structure including any of oxide insulating films such as a silicon oxide layer, a silicon oxynitride layer, an aluminum oxide layer, and an aluminum oxynitride layer, and nitride insulating films such as a silicon nitride layer, a silicon nitride oxide layer, an aluminum nitride layer, and an aluminum nitride oxide layer.

In this embodiment, an aluminum oxide film is used as the insulating film 631. The insulating film 631 can be formed by a sputtering method or a plasma CVD method.

The aluminum oxide film provided as the insulating film 631 over the oxide semiconductor film has a high shielding effect (blocking effect) of preventing penetration of both oxygen and impurities such as hydrogen and moisture.

Therefore, during and after the manufacturing process, the aluminum oxide film functions as a protective film for preventing entry of impurities such as hydrogen and moisture, which can cause a change, into the oxide semiconductor film and release of oxygen, which is a main constituent material of the oxide semiconductor, from the oxide semiconductor film.

For a reduction in surface roughness, an insulating film functioning as a planarization insulating film is preferably used as each of the interlayer insulating films 633 and 634. For the interlayer insulating films 633 and 634, for example, an organic insulating material having heat resistance, such as polyimide, an acrylic resin, a benzocyclobutene resin, polyamide, or an epoxy resin, can be used. Other than such organic insulating materials, it is possible to use a single layer or stacked layers of a low-dielectric constant material (low-k material), a siloxane-based resin, phosphosilicate glass (PSG), borophosphosilicate glass (BPSG), or the like.

With detection of light 622 that enters the photodiode 602, data on an object to be detected can be read. Note that a light source such as a backlight can be used at the time of reading data on an object to be detected.

The transistor 640 has a structure similar to that of the transistor 410 described in Embodiment 1, and is obtained by a manufacturing method similar to that of the transistor 410. In the manufacturing method, a source electrode layer and a drain electrode layer are formed through an etching step using an etching gas containing a halogen element, and then a step in which impurities contained in the etching gas are removed from a surface of the oxide semiconductor film and the vicinity thereof is performed. For the impurity removal step, for example, dilute hydrofluoric acid treatment or plasma treatment using oxygen or dinitrogen monoxide can be favorably employed.

Since the surface of the oxide semiconductor film and the vicinity thereof can be prevented from being contaminated by impurities contained in the etching gas, on the surface of the oxide semiconductor film of the transistor 640, the halogen element concentration can be lower than or equal to $5 \times 10^{18}$ atoms/cm$^3$ (preferably lower than or equal to $1 \times 10^{18}$ atoms/cm$^3$).

Accordingly, a highly reliable semiconductor device including the transistor 640 of this embodiment, which is formed using an oxide semiconductor film and has stable electric characteristics, can be provided. Further, a highly reliable semiconductor device can be manufactured with a high yield, so that high productivity can be achieved.

The structures, methods, and the like described in this embodiment can be combined as appropriate with any of structures, methods, and the like described in the other embodiments.

Embodiment 5

A semiconductor device disclosed in this specification can be applied to a variety of electronic devices (including game machines). Examples of electronic devices include a television set (also referred to as a television or a television receiver), a monitor of a computer or the like, cameras such as a digital camera and a digital video camera, a digital photo frame, a mobile phone, a portable game machine, a portable information terminal, an audio reproducing device, a game machine (e.g., a pachinko machine or a slot machine), and a game console. Specific examples of such electronic devices are illustrated in FIGS. 9A to 9C.

Figure 9A:
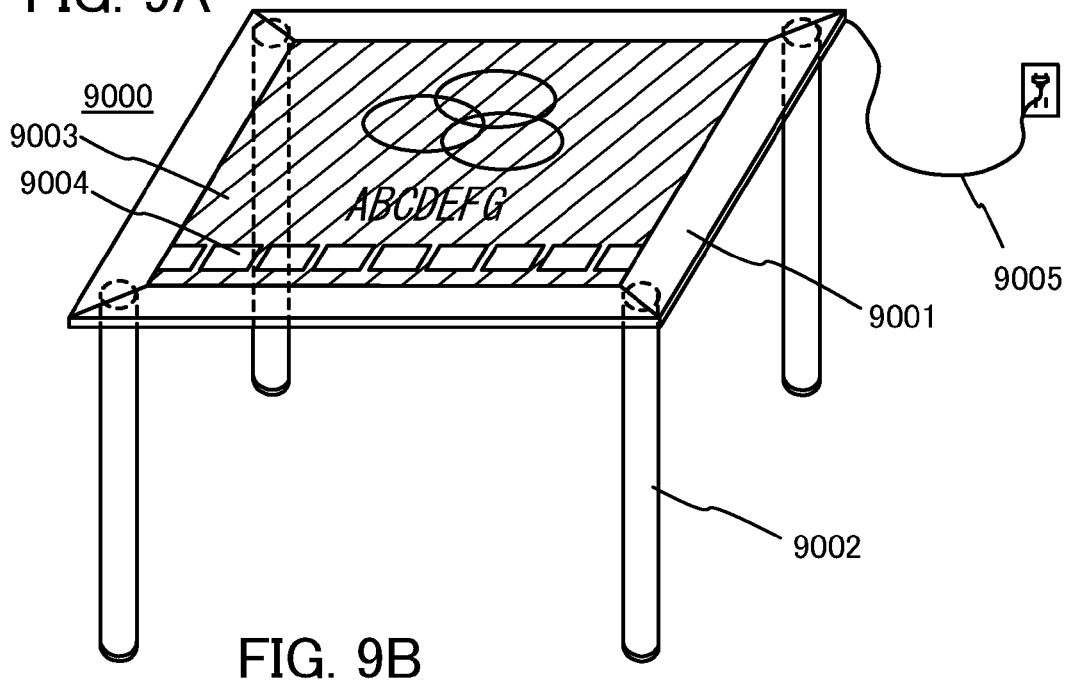
FIGS. 9A to 9C are diagrams illustrating electronic devices.
Figure 9B:
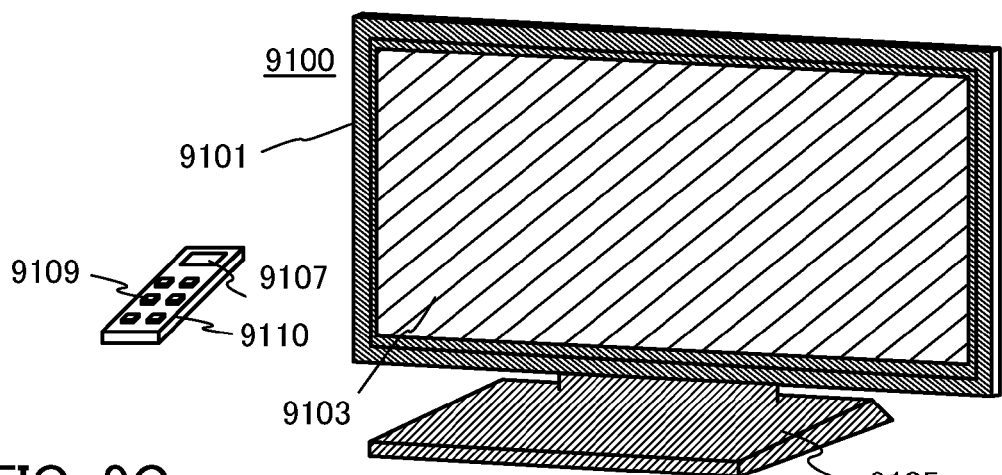
Figure 9C:
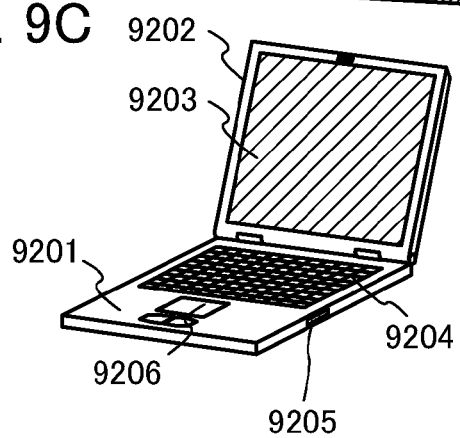

FIG. 9A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The semiconductor device described in any of Embodiments 1 to 4 can be used for the display portion 9003, so that the electronic device can have high reliability.

The display portion 9003 has a touch input function. When a user touches displayed buttons 9004 which are displayed on the display portion 9003 of the table 9000 with his or her finger or the like, the user can operate the screen and input data. Further, when communication with or control of another home appliance is possible, the display portion 9003 may function as a control device for controlling the home appliance by operation of the screen. For example, with the use of the semiconductor device having an image sensor function described in Embodiment 4, the display portion 9003 can have a touch input function.

Further, the screen of the display portion 9003 can be placed perpendicular to a floor with a hinge provided for the housing 9001; thus, the table 9000 can also be used as a television set. When a television set having a large screen is set in a small room, an open space is reduced; however, when a display portion is incorporated in a table, a space in the room can be efficiently used.

FIG. 9B illustrates a television set 9100. In the television set 9100, a display portion 9103 is incorporated in a housing 9101, and an image can be displayed on the display portion 9103. Note that the housing 9101 is supported by a stand 9105 here.

The television set 9100 can be operated with an operation switch of the housing 9101 or a separate remote controller 9110. Channels and volume can be controlled with operation keys 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 9B is provided with a receiver, a modem, and the like. With the use of the receiver, the television set 9100 can receive general television broadcasting. Moreover, when the television set 9100 is connected to a communication network with or without wires via the modem, one-way (from a sender to a receiver) or two-way (between a sender and a receiver, between receivers, or the like) data communication can be performed.

The semiconductor device described in any of Embodiments 1 to 4 can be used for the display portions 9103 and 9107, so that the television set and the remote controller can have high reliability.

FIG. 9C illustrates a computer which includes a main body 9201, a housing 9202, a display portion 9203, a keyboard 9204, an external connection port 9205, a pointing device 9206, and the like.

The semiconductor device described in any of Embodiments 1 to 4 can be used for the display portion 9203, so that the computer can have high reliability.

Figure 10A:
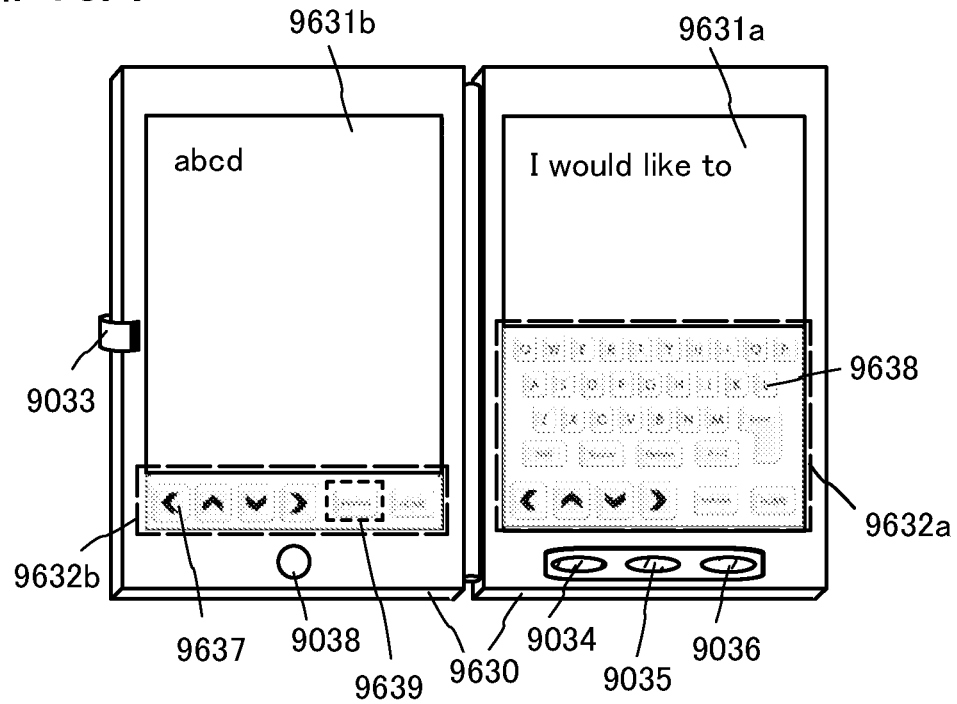
FIGS. 10A to 10C are diagrams illustrating an electronic device.
Figure 10B:
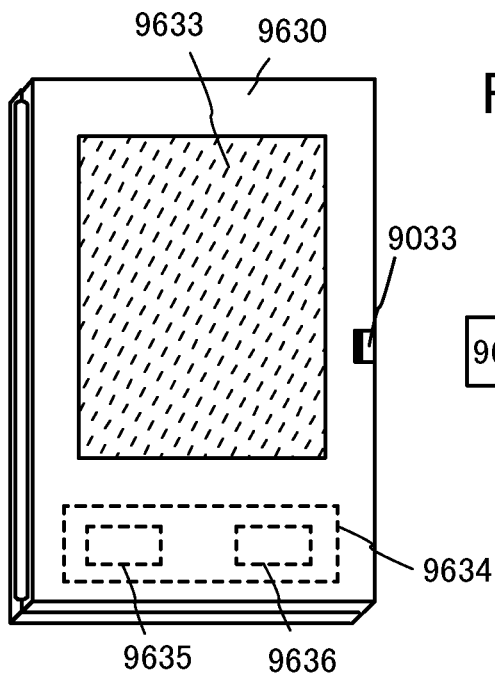

FIGS. 10A and 10B illustrate a tablet terminal which can be folded in two. In FIG. 10A, the tablet terminal is opened and includes a housing 9630, a display portion 9631*a*, a display portion 9631*b*, a display-mode switching button 9034, a power button 9035, a power-saving-mode switching button 9036, a clip 9033, and an operation button 9038.

The semiconductor device described in any of Embodiments 1 to 4 can be used for the display portion 9631*a* and the display portion 9631*b*, so that the tablet terminal can have high reliability.

Part of the display portion 9631*a* can be a touch panel region 9632*a*, and data can be input by touching displayed operation keys 9638. Note that half of the display portion 9631*a* has only a display function and the other half has a touch panel function. However, the structure of the display portion 9631*a* is not limited to this, and the whole display portion 9631*a* may have a touch panel function. For example, keyboard buttons can be displayed on the whole display portion 9631*a* to be used as a touch panel, and the display portion 9631*b* can be used as a display screen.

Similarly to the display portion 9631*a*, part of the display portion 9631*b* can be a touch panel region 9632*b*. When a keyboard display switching button 9639 displayed on the touch panel is touched with a finger, a stylus, or the like, keyboard buttons can be displayed on the display portion 9631*b*.

The touch panel region 9632*a* and the touch panel region 9632*b* can be controlled by touch input at the same time.

The display-mode switching button 9034 allows switching between a landscape mode and a portrait mode, color display and black-and-white display, and the like. The power-saving-mode switching button 9036 allows the display luminance to be optimized in accordance with the amount of external light in use which is detected by an optical sensor incorporated in the tablet terminal. In addition to the optical sensor, another detection device such as a sensor for detecting inclination, like a gyroscope or an acceleration sensor may be incorporated in the tablet terminal.

Although FIG. 10A illustrates an example in which the display area of the display portion 9631*a* is the same as that of the display portion 9631*b*, one embodiment of the present invention is not limited to this example. They may differ in size and/or display quality. For example, one display panel may be capable of higher-definition display than the other display panel.

The tablet terminal is closed in FIG. 10B. The tablet terminal includes the housing 9630, a solar cell 9633, a charge and discharge control circuit 9634, a battery 9635, and a DC-DC converter 9636. As an example, FIG. 10B illustrates the charge and discharge control circuit 9634 including the battery 9635 and the DC-DC converter 9636.

Since the tablet terminal can be folded in two, the housing 9630 can be closed when not in use. Thus, the display portion 9631*a* and the display portion 9631*b* can be protected, which makes it possible to provide a tablet terminal with excellent durability and excellent reliability for long-term use.

The tablet terminal illustrated in FIGS. 10A and 10B can also have a function of displaying various kinds of data (e.g., a still image, a moving image, and a text image), a function of displaying a calendar, a date, the time, or the like on the display portion, a touch input function of operating or editing data displayed on the display portion by touch input, a function of controlling processing by various kinds of software (programs), and the like.

The solar cell 9633, which is attached on a surface of the tablet terminal, can supply power to the touch panel, the display portion, an image signal processor, and the like. Note that the solar cell 9633 can be provided on one or both surfaces of the housing 9630, and thus, the battery 9635 can be charged efficiently. When a lithium ion battery is used as the battery 9635, there is an advantage of downsizing or the like.

Figure 10C:
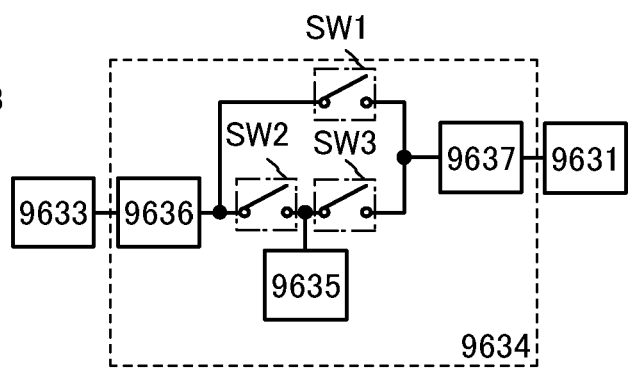

The structure and operation of the charge and discharge control circuit 9634 illustrated in FIG. 10B are described with reference to a block diagram of FIG. 10C. FIG. 10C illustrates the solar cell 9633, the battery 9635, the DC-DC converter 9636, a converter 9637, switches SW1 to SW3, and a display portion 9631. The battery 9635, the DC-DC converter 9636, the converter 9637, and the switches SW1 to SW3 correspond to the charge and discharge control circuit 9634 illustrated in FIG. 10B.

First, an example of operation in the case where power is generated by the solar cell 9633 using external light is described. The voltage of power generated by the solar cell 9633 is raised or lowered by the DC-DC converter 9636 to a voltage for charging the battery 9635. When the display portion 9631 is operated with the power from the solar cell 9633, the switch SW1 is turned on and the voltage of the power is raised or lowered by the converter 9637 to a voltage needed for operating the display portion 9631. In addition, when display on the display portion 9631 is not performed, the switch SW1 is turned off and the switch SW2 is turned on so that the battery 9635 is charged.

Although the solar cell 9633 is shown as an example of a power generation means, there is no particular limitation on the power generation means and the battery 9635 may be charged with another power generation means such as a piezoelectric element or a thermoelectric conversion element (Peltier element). For example, a non-contact power transmission module which transmits and receives power wirelessly (without contact) to charge the battery 9635, or a combination of the solar cell 9633 and another charge means may be used.

The structures, methods, and the like described in this embodiment can be combined as appropriate with any of structures, methods, and the like described in the other embodiments.

Example 1

In this example, a metal film was formed over and in contact with an oxide semiconductor film, and then dry etching was performed to remove the metal film. The following experiment was conducted to examine the relation between resistivity and whether or not an impurity-removing treatment is performed to remove an impurity generated by the dry etching.

First, as a comparative sample, a 95-nm-thick IGZO film was formed over a glass substrate with the use of a film formation apparatus using a sputtering method, and the resistivity of the IGZO film was measured. The result was 4.8× $10^9 \Omega \cdot cm$. The resistivity of the IGZO film was obtained in the following manner: an electrode (a stack of a 100-nm-thick titanium film, a 400-nm-thick aluminum film, and a 100-nm-thick titanium film) having a meandering top shape was formed, and the resistance was obtained by a voltage-current two-wire measurement.

The IGZO film was formed under the following condition: an oxide target of In:Ga:Zn=1:1:1 [atomic ratio] was used, the atmosphere was an atmosphere of oxygen and argon (oxygen flow rate: 50%), the pressure was 0.6 Pa, the power of the AC power source was 5 kW, and the substrate temperature was 170° C.

A film formation apparatus using a sputtering method includes a sputtering chamber in which the pressure can be reduced by a vacuum evacuation unit such as a vacuum pump (e.g., a cryopump or a turbo molecular pump), a substrate holder on which a substrate to be processed is fixed, a target holder which holds a sputtering target, an electrode for the sputtering target held by the target holder, a power supply unit which applies AC voltage (or DC voltage) for sputtering to the electrode, and a gas supply unit which supplies a gas to the sputtering chamber. In fabrication of the sample, the sputtering chamber is kept under high vacuum so as to prevent entry of impurities as much as possible, and film formation is performed in a dry nitrogen atmosphere in which, in terms of moisture, the dew point is −40° C. or lower, preferably −50° C. or lower.

Sample 1 was obtained in such a manner that a 95-nm-thick IGZO film was formed over a glass substrate, etching was performed under a first dry etching condition for 180 seconds, and immersion in pure water was performed. Then an electrode was formed and the resistivity was measured. The result of Sample 1 was 130Ω·cm. Sample 2 was obtained by performing immersion in dilute hydrofluoric acid (diluted to 1/100) for 30 seconds after the etching under the first dry etching condition. Then an electrode was formed and the resistivity was measured. The result of Sample 2 was 3.9× $10^9 \Omega \cdot cm$.

These results confirm the following: dry etching using a gas containing a halogen element causes an impurity to be attached to or mixed into the IGZO film, so that the resistivity thereof is lowered; however, the impurity is removed by surface treatment using dilute hydrofluoric acid, so that the IGZO film has a state close to that before the dry etching.

Sample 3 was obtained in such a manner that a 95-nm-thick IGZO film was formed over a glass substrate, etching was performed under a second dry etching condition for 180 seconds, and immersion in pure water was performed. Then an electrode was formed and the resistivity was measured. Sample 4 was obtained by performing immersion in dilute hydrofluoric acid (diluted to 1/100) for 30 seconds after the etching under the second dry etching condition. Then an electrode was formed and the resistivity was measured.

Sample 5 was obtained in such a manner that a 95-nm-thick IGZO film was formed over a glass substrate, etching was performed under a third dry etching condition for 180 seconds, and immersion in pure water was performed. Then an electrode was formed and the resistivity was measured. Sample 6 was obtained by performing immersion in dilute hydrofluoric acid (diluted to 1/100) for 30 seconds after the etching under the third dry etching condition. Then an electrode was formed and the resistivity was measured.

Sample 7 was obtained in such a manner that a 95-nm-thick IGZO film was formed over a glass substrate, etching was performed under a fourth dry etching condition for 180 seconds, and immersion in pure water was performed. Then an electrode was formed and the resistivity was measured. Sample 8 was obtained by performing immersion in dilute hydrofluoric acid (diluted to 1/100) for 30 seconds after the etching under the fourth dry etching condition. Then an electrode was formed and the resistivity was measured.

Table 1 shows the first dry etching condition, the second dry etching condition, the third dry etching condition, and the fourth dry etching condition. As an apparatus for dry etching, an inductively coupled plasma (ICP) etching apparatus was used.

TABLE 1

| | ICP (W) | Bias (W) | Pressure (Pa) | $Cl_2$ (sccm) | $BCl_3$ (sccm) | $SF_6$ (sccm) | $O_2$ (sccm) | Time (sec) |
|---|---|---|---|---|---|---|---|---|
| First etching condition | 2000 | 200 | 2.0 | — | — | 900 | 100 | 180 |
| Second etching condition | 2000 | 1000 | 2.5 | 540 | — | 540 | — | — |
| Third etching condition | 0 | 1500 | 2.0 | 150 | 750 | — | — | — |
| Fourth etching condition | 2000 | 1000 | 2.5 | — | 380 | 700 | — | — |

Figure 12:
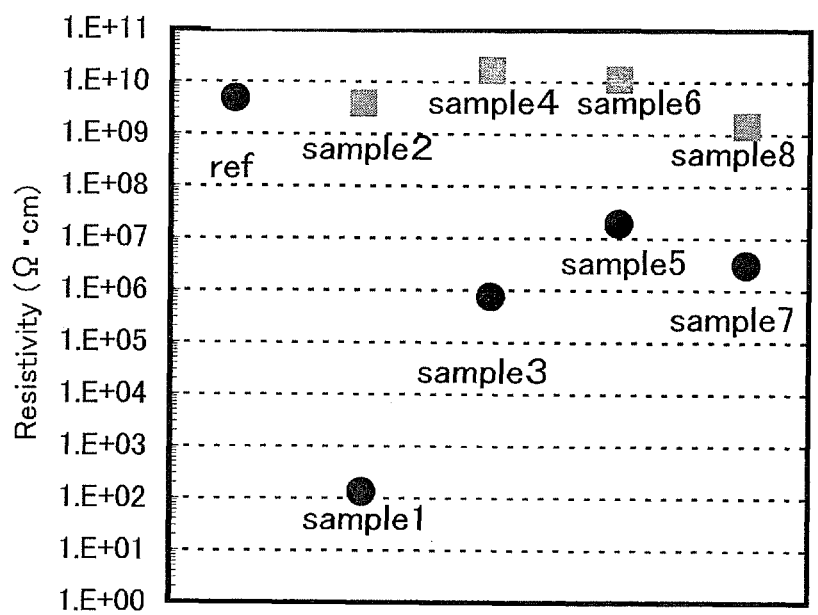
FIG. 12 is a graph showing a relation between resistivity and whether or not dilute hydrofluoric acid treatment is performed.

In a graph of FIG. 12, the vertical axis represents resistivity and the resistivity of the comparative sample (ref) and the resistivities of Samples 1 to 8 are shown. The results confirm that, regardless of dry etching condition, surface treatment using dilute hydrofluoric acid enables the IGZO film to have a state close to, preferably the same as, that before the dry etching.

The above results indicate that an impurity that can lower the resistance of an oxide semiconductor film can be removed by the impurity removal treatment, so that the decrease in the resistance of the oxide semiconductor film can be prevented.

Example 2

In this example, results of comparison between characteristics of a transistor which was subjected to impurity removal treatment and those of a transistor which was not subjected to the impurity removal treatment are described.

Respective methods for fabricating Samples A to D used in this example are described below. Note that a method for forming a transistor which is included in each of Samples A to D fabricated in this example is described with reference to FIGS. 4A to 4E.

First, a method for fabricating Sample A is described. As illustrated in FIG. 4A, a 100-nm-thick silicon nitride film and a 150-nm-thick silicon oxynitride film were formed as a base insulating film over a glass substrate used as the substrate 400. After that, a 30-nm-thick tantalum nitride film, a 200-nm-thick copper film, and a 30-nm-thick tungsten film were formed by a sputtering method. Through a photolithography process, a resist mask was formed over the tungsten film and selective etching was performed, so that the gate electrode layer 401 was formed. Note that the base insulating film is not illustrated in FIGS. 4A to 4E.

Next, a 50-nm-thick silicon nitride film and a 270-nm-thick silicon oxynitride film were formed as the gate insulating film 402 over the gate electrode layer 401 by a plasma CVD method. The formation condition for the silicon nitride film was as follows: an atmosphere of $SiH_4/N_2$=50 sccm/5000 sccm was used, the deposition power was 150 W (RF), the deposition pressure was 40 Pa, and the substrate temperature was 350° C. The formation condition for the silicon oxynitride film was as follows: an atmosphere of $SiH_4/N_2O$=20 sccm/3000 sccm was used, the deposition power was 100 W (RF) when the electrode area was 6000 cm$^2$, the deposition pressure was 40 Pa, and the substrate temperature was 350° C.

Next, a 35-nm-thick IGZO film was formed as an oxide semiconductor film over the gate insulating film 402 by a sputtering method. The IGZO film was formed in such a manner that a sputtering target of In:Ga:Zn=1:1:1 [atomic ratio] was used, argon and oxygen were supplied as a sputtering gas into a treatment chamber of a sputtering apparatus at a flow rate of 100 sccm for each, and film formation was performed at a power of 5 kW with the pressure in the treatment chamber controlled to 0.6 Pa. Note that the IGZO film was formed at a substrate temperature of 170° C.

Next, through a photolithography process, a resist mask was formed over the oxide semiconductor film and selective etching was performed, so that the island-shaped oxide semiconductor film 403 was formed.

Next, first heat treatment was performed at 450° C. in a nitrogen atmosphere for 1 hour and further at 450° C. in a mixed atmosphere of nitrogen and oxygen for 1 hour.

Next, as illustrated in FIG. 4B, a 50-nm-thick tungsten film, a 100-nm-thick aluminum film, and a 100-nm-thick titanium film were formed as the conductive film 445 over the island-shaped oxide semiconductor film 403 by a sputtering method. After that, as illustrated in FIG. 4C, through a photolithography process, a resist mask was formed over the titanium film and selective etching was performed, so that the source electrode layer 405a and the drain electrode layer 405b were formed.

Here, the etching condition for the aluminum film and the titanium film was as follows: an etching gas ($BCl_3:Cl_2$=750 sccm:150 sccm) was used, the bias power was 1500 W, the power of the ICP power source was 0 W, and the pressure was 2.0 Pa. The etching condition for the tungsten film was as follows: an etching gas ($SF_6:BCl_3$=700 sccm:380 sccm) was used, the bias power was 1000 W, the power of the ICP power source was 2000 W, and the pressure was 2.5 Pa.

Next, second heat treatment was performed at 300° C. in a nitrogen atmosphere for 1 hour.

Next, as illustrated in FIG. 4E, a 400-nm-thick silicon oxide film and a 200-nm-thick silicon oxynitride film were formed as an interlayer insulating film over the oxide semiconductor film 403, the source electrode layer 405a, and the drain electrode layer 405b.

Next, third heat treatment was performed at 300° C. in a nitrogen atmosphere for 1 hour.

Next, a 1.5-μm-thick polyimide film was formed as an interlayer insulating film.

Next, fourth heat treatment was performed at 300° C. in a nitrogen atmosphere for 1 hour.

Next, openings reaching the source electrode layer 405a and the drain electrode layer 405b were formed in the interlayer insulating films. Finally, a 100-nm-thick titanium film, a 400-nm-thick aluminum film, and a 100-nm-thick titanium film were formed by a sputtering method. After that, through a photolithography process, a resist mask was formed over the titanium film and selective etching was performed, so that electrode layers were formed.

Through the above process, Sample A was fabricated.

Next, a method for fabricating Sample B is described. Sample B was fabricated in a manner similar to that of Sample A up to and including the step for forming the source electrode layer and the drain electrode layer.

As illustrated in FIG. 4D, oxygen plasma treatment was performed on the oxide semiconductor film 403 after the formation of the source electrode layer 405a and the drain electrode layer 405b. The oxygen plasma treatment was performed under the following condition: an ICP apparatus was used, the power of the ICP power source was 0 W, the bias power was 500 W, the pressure was 2.0 Pa, and the substrate temperature was 80° C.

After that, steps from the second heat treatment to the step for forming the electrode layers were performed in a manner similar to that of Sample A; thus, Sample B was fabricated.

Next, a method for fabricating Sample C is described. Sample C was fabricated in a manner similar to that of Sample A up to and including the step for forming the source electrode layer and the drain electrode layer.

As illustrated in FIG. 4D, oxygen plasma treatment was performed on the oxide semiconductor film 403 after the formation of the source electrode layer 405a and the drain electrode layer 405b. The oxygen plasma treatment was performed under the following condition: an ICP apparatus was used, the power of the ICP power source was 0 W, the bias power was 500 W, the pressure was 2.0 Pa, and the substrate temperature was 80° C.

Next, the oxide semiconductor film was immersed in dilute hydrofluoric acid (diluted to 1/500) for 60 seconds.

After that, steps from the second heat treatment to the step for forming the electrode layers were performed in a manner similar to that of Sample A; thus, Sample C was fabricated.

Next, a method for fabricating Sample D is described. Sample D was fabricated in a manner similar to that of Sample C except for the time to immerse the oxide semiconductor film 403 in dilute hydrofluoric acid.

The oxide semiconductor film 403 of Sample D was immersed in dilute hydrofluoric acid (diluted to 1/500) for 120 seconds.

Then electric characteristics of each of Samples A to D were evaluated.

Figure 13A:
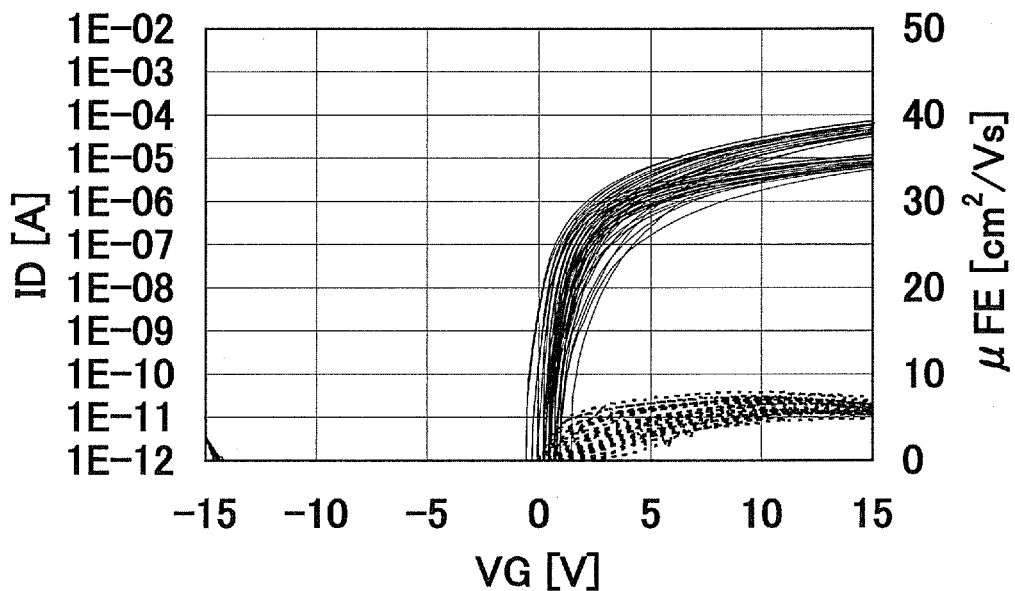
FIGS. 13A and 13B are graphs showing electric characteristics of Sample A and Sample B, respectively.
Figure 13B:
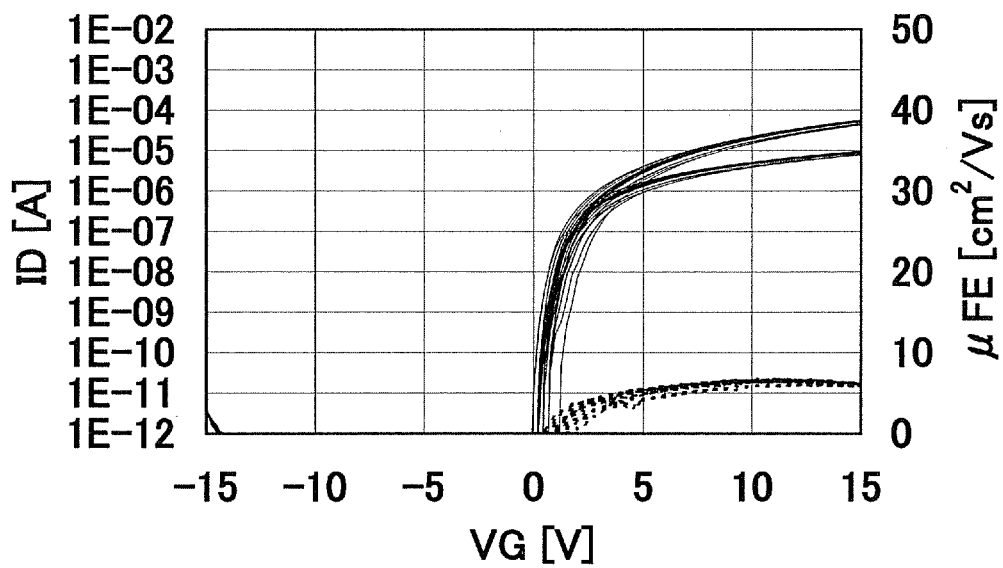
Figure 14A:
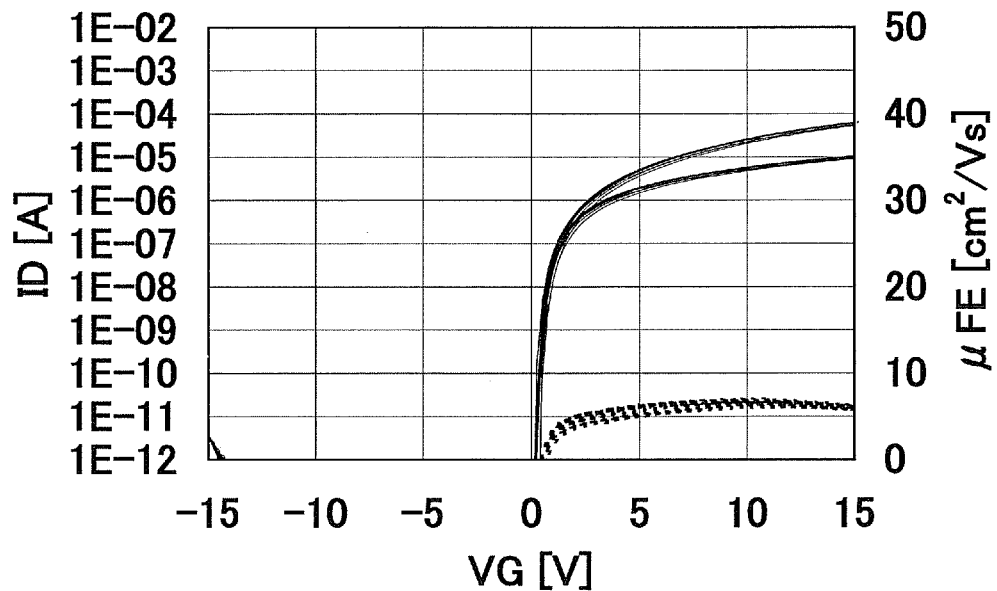
FIGS. 14A and 14B are graphs showing electric characteristics of Sample C and Sample D, respectively.
Figure 14B:
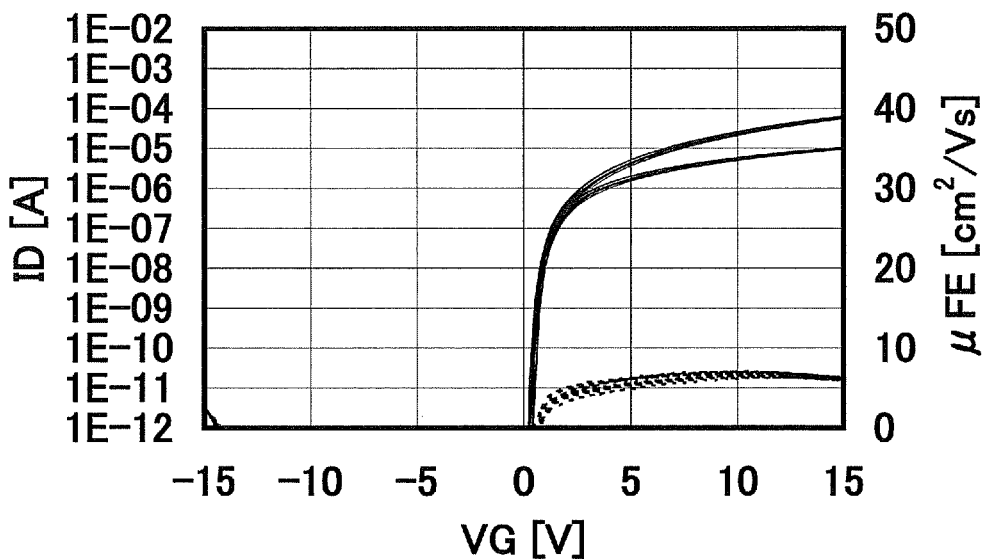

FIG. 13A shows measurement results of Vg-Id characteristics of Sample A. FIG. 13B shows measurement results of Vg-Id characteristics of Sample B. FIG. 14A shows measurement results of Vg-Id characteristics of Sample C. FIG. 14B shows measurement results of Vg-Id characteristics of Sample D.

The following is confirmed from the results in FIGS. 13A and 13B and FIGS. 14A and 14B. Sample A, which was not subjected to impurity removal step after the formation of the source electrode layer 405a and the drain electrode layer 405b, has variation in electric characteristics. In contrast, Sample B, which was subjected to oxygen plasma treatment after the formation of the source electrode layer 405a and the drain electrode layer 405b, has less variation in electric characteristics than Sample A. Moreover, Samples C and D, which were subjected to dilute hydrofluoric acid treatment in addition to oxygen plasma treatment, have further less variation in electric characteristics.

The above results indicate that the impurity removal step performed after the formation of the source electrode layer 405a and the drain electrode layer 405b enables a reduction in variation in electric characteristics of the transistor.

This application is based on Japanese Patent Application serial no. 2011-233264 filed with the Japan Patent Office on Oct. 24, 2011, the entire contents of which are hereby incorporated by reference.

What is claimed is:

1. A method for manufacturing a semiconductor device, comprising the steps of:
   forming a gate electrode layer over an insulating surface;
   forming a gate insulating film over the gate electrode layer;
   forming an island-shaped oxide semiconductor film over the gate electrode layer with the gate insulating film interposed therebetween;
   forming a conductive film over the gate insulating film and the island-shaped oxide semiconductor film;
   processing the conductive film by plasma treatment using an etching gas containing a halogen element, so that a source electrode layer and a drain electrode layer are formed; and
   performing impurity removal treatment on the island-shaped oxide semiconductor film to remove the halogen element contained in the etching gas,
   wherein the impurity removal treatment includes oxygen plasma treatment or dinitrogen monoxide plasma treatment, and
   wherein a surface of the island-shaped oxide semiconductor film on which the impurity removal treatment has been performed has a halogen concentration lower than or equal to $5 \times 10^{18}$ atoms/cm$^3$.

2. The method for manufacturing a semiconductor device according to claim 1,
   wherein cleaning treatment using a dilute hydrofluoric acid solution is performed as the impurity removal treatment.

3. The method for manufacturing a semiconductor device according to claim 1,
   wherein, as the impurity removal treatment, oxygen plasma treatment or dinitrogen monoxide plasma treatment is performed and then cleaning treatment using a dilute hydrofluoric acid solution is performed.

4. A method for manufacturing a semiconductor device, comprising the steps of:
   forming a gate electrode layer over an insulating surface;
   forming a gate insulating film over the gate electrode layer;
   forming an island-shaped oxide semiconductor film over the gate electrode layer with the gate insulating film interposed therebetween;
   forming a conductive film electrically connected to the island-shaped oxide semiconductor film;
   processing the conductive film by plasma treatment using an etching gas containing a halogen element, so that a source electrode layer and a drain electrode layer are formed; and
   performing impurity removal treatment on the island-shaped oxide semiconductor film to remove the halogen element contained in the etching gas,
   wherein the impurity removal treatment includes oxygen plasma treatment or dinitrogen monoxide plasma treatment, and
   wherein a surface of the island-shaped oxide semiconductor film on which the impurity removal treatment has been performed has a halogen concentration lower than or equal to $5 \times 10^{18}$ atoms/cm$^3$.

5. The method for manufacturing a semiconductor device according to claim 4,
   wherein cleaning treatment using a dilute hydrofluoric acid solution is performed as the impurity removal treatment.

6. The method for manufacturing a semiconductor device according to claim 4,
   wherein, as the impurity removal treatment, oxygen plasma treatment or dinitrogen monoxide plasma treatment is performed and then cleaning treatment using a dilute hydrofluoric acid solution is performed.

* * * * *